US012575350B2

(12) United States Patent     (10) Patent No.: US 12,575,350 B2
Hirayama et al.     (45) Date of Patent: Mar. 10, 2026

(54) SUBSTRATE PROCESSING METHOD AND SUBSTRATE PROCESSING APPARATUS

(71) Applicant: Tokyo Electron Limited, Tokyo (JP)

(72) Inventors: Tsukasa Hirayama, Kumamoto (JP);
Takao Inada, Kumamoto (JP);
Hironobu Hyakutake, Kumamoto (JP);
Kazuya Koyama, Kumamoto (JP);
Hisashi Kawano, Kumamoto (JP)

(73) Assignee: TOKYO ELECTRON LIMITED,
Tokyo (JP)

( * ) Notice: Subject to any disclaimer, the term of this patent is extended or adjusted under 35 U.S.C. 154(b) by 227 days.

(21) Appl. No.: 17/367,975

(22) Filed: Jul. 6, 2021

(65) Prior Publication Data

US 2021/0335621 A1     Oct. 28, 2021

Related U.S. Application Data

(62) Division of application No. 16/778,267, filed on Jan. 31, 2020, now Pat. No. 11,087,992.

(30) Foreign Application Priority Data

Feb. 5, 2019    (JP) .................................. 2019-018684

(51) Int. Cl.
*H01L 21/311*     (2006.01)
*B08B 3/08*     (2006.01)
*H01L 21/02*     (2006.01)
*H01L 21/306*     (2006.01)
(Continued)

(52) U.S. Cl.
CPC .......... *H01L 21/31111* (2013.01); *B08B 3/08* (2013.01); *H01L 21/0206* (2013.01); *H01L 21/30604* (2013.01); *H01L 21/30608* (2013.01); *H01L 21/32133* (2013.01); *H01L 21/32134* (2013.01); *H01L 21/67023* (2013.01); *H01L 21/67086* (2013.01)

(58) Field of Classification Search
None
See application file for complete search history.

(56) References Cited

U.S. PATENT DOCUMENTS

| | | | | |
|---|---|---|---|---|
| 4,217,182 A | * | 8/1980 | Cross | ........................ C25D 5/02 |
| | | | | 174/250 |
| 6,194,232 B1 | * | 2/2001 | Kao | ................. G05B 19/41865 |
| | | | | 438/907 |
| 9,673,216 B1 | * | 6/2017 | Baraskar | ........... H01L 29/40114 |

(Continued)

FOREIGN PATENT DOCUMENTS

| | | |
|---|---|---|
| JP | 2015-115455 A | 6/2015 |
| JP | 2016-143684 A | 8/2016 |

(Continued)

*Primary Examiner* — Keath T Chen
*Assistant Examiner* — Margaret Klunk
(74) *Attorney, Agent, or Firm* — Venjuris, P.C.

(57) ABSTRACT

An etching method includes a first etching step, a processing step, and a second etching step. The first etching step is performed to etch a substrate on which a silicon oxide film and a silicon nitride film are formed with an etching liquid. The processing step is performed to process a pattern in the silicon oxide film on the substrate with a pattern shape processing liquid after the first etching step. The second etching step is performed to etch the substrate with the etching liquid after the processing step.

9 Claims, 19 Drawing Sheets

(51) Int. Cl.
     *H01L 21/3213*     (2006.01)
     *H01L 21/67*       (2006.01)

(56)                    References Cited

U.S. PATENT DOCUMENTS

| | | | | | |
|---|---|---|---|---|---|
| 2005/0268939 | A1* | 12/2005 | Park | ......... | H01L 21/67057 |
| | | | | | 257/E21.255 |
| 2006/0255014 | A1* | 11/2006 | Ogawa | ......... | H01L 21/31111 |
| | | | | | 216/84 |
| 2012/0145672 | A1 | 6/2012 | Ratkovich et al. | | |
| 2012/0240958 | A1* | 9/2012 | Higuchi | ......... | H01L 21/67051 |
| | | | | | 134/10 |
| 2014/0273501 | A1* | 9/2014 | Glodde | ......... | G03F 7/091 |
| | | | | | 438/753 |
| 2015/0255266 | A1* | 9/2015 | Ma | ......... | H01L 21/67086 |
| | | | | | 156/345.31 |
| 2015/0270151 | A1* | 9/2015 | Yokoyama | ......... | H01L 21/67751 |
| | | | | | 414/222.03 |
| 2016/0035597 | A1* | 2/2016 | Hinode | ......... | H01L 21/6708 |
| | | | | | 216/84 |
| 2016/0233106 | A1* | 8/2016 | Furukawa | ......... | H01L 21/67086 |
| 2016/0336202 | A1* | 11/2016 | Sato | ......... | H01L 21/67086 |
| 2017/0062231 | A1* | 3/2017 | Sato | ......... | H01L 21/30608 |
| 2017/0287726 | A1 | 10/2017 | Basset et al. | | |
| 2018/0233383 | A1* | 8/2018 | Ashidate | ......... | H01L 21/31111 |
| 2019/0122906 | A1* | 4/2019 | Zhang | ......... | H01L 21/67086 |
| 2019/0148183 | A1* | 5/2019 | Inada | ......... | H01L 21/67017 |
| | | | | | 438/745 |
| 2020/0312667 | A1* | 10/2020 | Sato | ......... | H01L 21/32134 |

FOREIGN PATENT DOCUMENTS

| | | | |
|---|---|---|---|
| JP | 2017-118092 | A | 6/2017 |
| JP | 2018-133551 | A | 8/2018 |
| KR | 20130111175 | A | 10/2013 |
| KR | 20180037598 | A | 4/2018 |

* cited by examiner

SUBSTRATE PROCESSING METHOD AND SUBSTRATE PROCESSING APPARATUS

CROSS-REFERENCE TO RELATED APPLICATION

This application is a divisional application of U.S. patent application Ser. No. 16/778,267, filed on Jan. 31, 2020, which claims priority from Japanese Application No. 2019-018684, filed on Feb. 5, 2019, all of which are incorporated herein in their entireties by reference.

TECHNICAL FIELD

The present disclosure relates to a substrate processing method and a substrate processing apparatus.

BACKGROUND

It has been known that a substrate processing apparatus performs an etching process on a substrate by immersing the substrate in a phosphoric acid processing liquid containing silicon (see, e.g., Japanese Patent Application Laid-Open No. 2016-143684).

SUMMARY

A substrate processing method according to an aspect of the present disclosure includes a first etching step, a processing step, and a second etching step. In the first etching step, a substrate on which a silicon oxide film and a silicon nitride film are formed is etched with an etching liquid. In the processing step, after the first etching step, a pattern formed in the silicon oxide film on the substrate is processed with a pattern shape processing liquid. In the second etching step, the substrate is etched with the etching liquid after the processing step.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawings, and claims are not meant to be limiting.

Other embodiments may be utilized, and other changes may be made without departing from the spirit or scope of the subject matter presented here.

Hereinafter, embodiments of a substrate processing method and a substrate processing apparatus disclosed herein will be described in detail with reference to the accompanying drawings. Further, the present disclosure is not limited to the following embodiments. In addition, the drawings are schematic, and a relationship between the dimensions of respective elements, the ratio of each element, and the like may differ from the actual situation. Further, there are cases in which parts having different dimensional relationships and ratios are included between the drawings.

In the related art, it is known that a substrate processing apparatus performs an etching process on a substrate by immersing the substrate in a phosphoric acid processing liquid containing silicon.

For example, by immersing the substrate in such a phosphoric acid processing liquid, a silicon nitride film may be selectively etched among the silicon nitride film (SiN) and the silicon oxide film ($SiO_2$) stacked on the substrate.

However, when the silicon nitride film is selectively etched in a substrate on which a large number of silicon nitride films and silicon oxide films is stacked (hereinafter, also referred to as "highly stacked"), a path that discharges the components of the etched silicon nitride film to the outside of the substrate becomes longer.

For this reason, the silicon concentration of the phosphoric acid processing liquid entering a gap formed between the silicon oxide films is increased, and silicon oxide may be deposited on the silicon oxide film. Therefore, there is a possibility that the pattern formed by the multilayer silicon oxide film does not have a desired shape due to the deposited silicon oxide.

Therefore, it is expected that a good pattern shape of the silicon oxide film may be obtained even on a substrate on which the silicon nitride film and the silicon oxide film are highly stacked.

<Configuration of Substrate Processing Apparatus>

Figure 1:
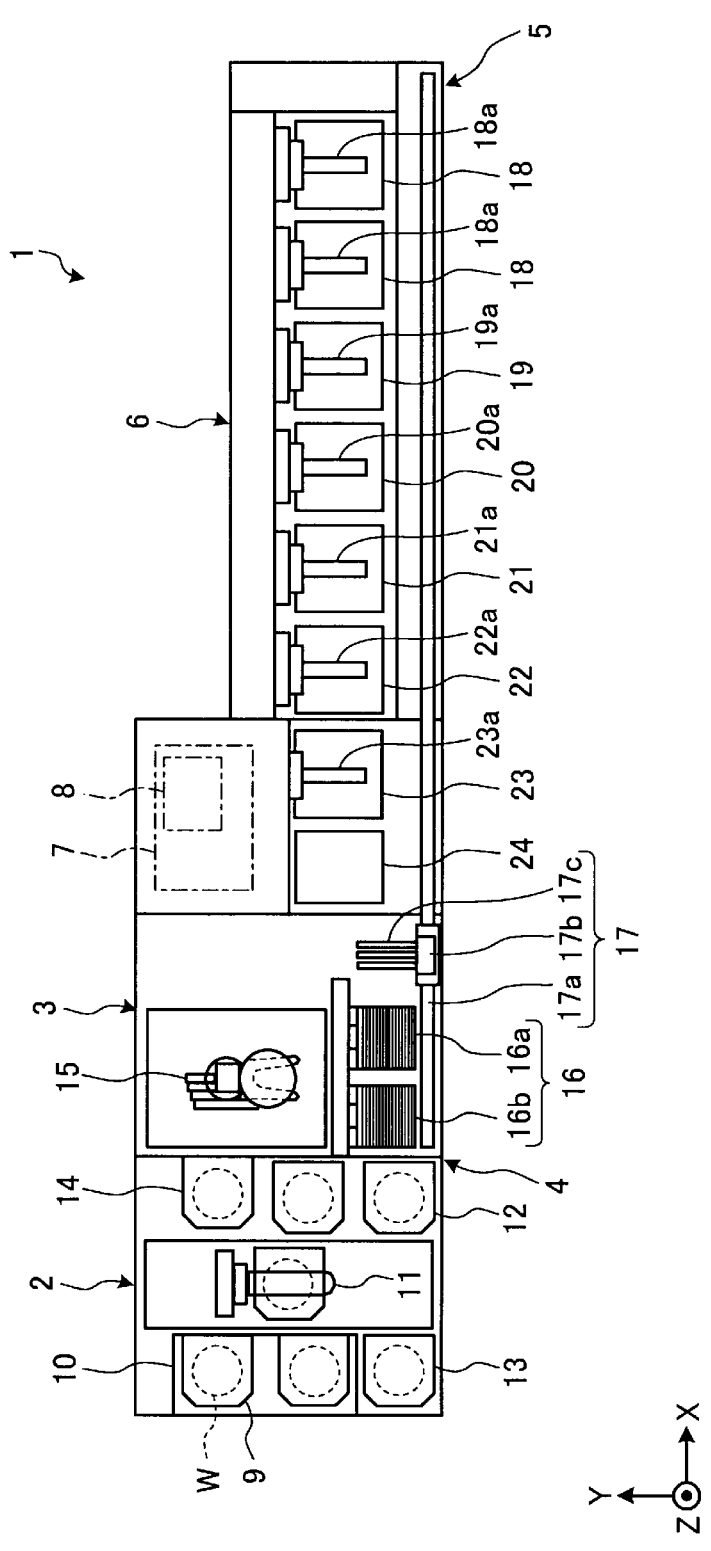
FIG. 1 is a schematic plan view of a substrate processing apparatus according to an embodiment.

First, the configuration of a substrate processing apparatus 1 according to an embodiment will be described with reference to FIG. 1. FIG. 1 is a schematic plan view of the substrate processing apparatus 1 according to the embodiment. In the following, in order to clarify positional relationships, the X-axis, Y-axis, and Z-axis which are orthogonal to each other are defined, and the positive Z-axis direction is regarded as a vertically upward direction.

As illustrated in FIG. 1, the substrate processing apparatus 1 according to the embodiment includes a carrier loading/unloading unit 2, a lot forming unit 3, a lot placing unit 4, a lot transfer unit 5, a lot processing unit 6, and a controller 7.

The carrier loading/unloading unit 2 loads/unloads a carrier 9 in which a plurality of (e.g., 25) wafers W are accommodated side by side in a horizontal posture. The wafer W is an example of a substrate.

The carrier loading/unloading unit 2 includes a carrier stage 10, a carrier transfer mechanism 11, carrier stocks 12 and 13, and a carrier mounting table 14. The carrier stage 10 places a plurality of carriers 9 transferred from the outside.

The carrier transfer mechanism 11 transfers the carrier 9 among the carrier stage 10, the carrier stocks 12 and 13, and the carrier mounting table 14. The carrier stocks 12 and 13 temporarily store the carrier 9.

The lot forming unit 3 includes a substrate transfer mechanism 15 and forms a lot. The lot is composed of a plurality (e.g., 50) of wafers W that is simultaneously processed by combining the wafers W accommodated in one or a plurality of carriers 9.

The substrate transfer mechanism 15 transfers a plurality of wafers W. The substrate transfer mechanism 15 may change the posture of the wafer W from the horizontal posture to the vertical posture and from the vertical posture to the horizontal posture during the transfer of the wafer W.

The substrate transfer mechanism 15 transfers the wafer W from the carrier 9 mounted on the carrier mounting table 14 to the lot placing unit 4. Further, the substrate transfer mechanism 15 transfers the wafer W from the lot placing unit 4 to the carrier 9 mounted on the carrier mounting table 14.

The lot placing unit 4 includes a lot transfer table 16 and temporarily places (waits for) a lot transferred between the lot forming unit 3 and the lot processing unit 6 by the lot transfer unit 5. The lot transfer table 16 includes a loading side lot mounting table 16a and an unloading side lot mounting table 16b.

The pre-processed lot formed in the lot forming unit 3 is placed on the loading side lot mounting table 16a. The lot processed by the lot processing unit 6 is placed on the unloading side lot mounting table 16b. A plurality of wafers W for one lot is placed side by side in a vertical posture on the loading side lot mounting table 16a and the unloading side lot mounting table 16b.

The lot transfer unit 5 includes a lot transfer mechanism 17 and transfers a lot between the lot placing unit 4 and the lot processing unit 6 or inside the lot processing unit 6. The lot transfer unit 5 is an example of a transfer unit. The lot transfer mechanism 17 includes a rail 17a, a moving body 17b, and a substrate holder 17c.

The rail 17a is disposed along the X-axis direction across the lot placing unit 4 and the lot processing unit 6. The moving body 17b is configured to be movable along the rail 17a while holding a plurality of wafers W. The substrate holder 17c is provided in the moving body 17b and holds a plurality of wafers W disposed in the vertical posture.

The lot transfer unit 5 transfers the lot placed on the loading side lot mounting table 16a to the lot processing unit 6. In addition, the lot transfer unit 5 transfers the lot processed by the lot processing unit 6 to the unloading side lot mounting table 16b. Further, the lot transfer unit 5 transfers the lot inside the lot processing unit 6.

The lot processing unit 6 performs an etching process, a cleaning process, a drying process, and the like with a plurality of wafers W arranged side by side in a vertical posture as one lot. In the lot processing unit 6, for example, two processing tanks 18 and one of processing tanks 19 to 24 are provided side by side along the rail 17a.

The processing tank 18 is an example of a first processing tank and a third processing tank and performs a lot etching process. A phosphoric acid processing liquid for etching (hereinafter, also referred to as an "etching liquid") is stored in the processing tank 18. Details of the processing tank 18 will be described later.

The processing tanks 19 and 22 perform a lot rinsing process. A processing liquid for rinsing (e.g., pure water, etc.) is stored in the processing tanks 19 and 22. The processing tank 20 is an example of a second processing tank and performs a lot processing step. The processing tank 20 stores a processing liquid for processing (hereinafter, also referred to as a "pattern shape processing liquid").

The processing tank 21 performs a lot cleaning process. The processing tank 21 stores a processing liquid for cleaning (e.g., SC-1 (a mixed liquid of ammonia, hydrogen peroxide, and water)).

The processing tank 23 performs a lot drying process. The processing tank 23 is supplied with a processing gas for drying (e.g., IPA (isopropyl alcohol)). The processing tank 24 performs a cleaning process on the substrate holder 17c. The processing tank 24 is supplied with a processing liquid and a drying gas used to clean the substrate holder 17c.

The processing tanks 18 to 22 are provided with substrate lifting mechanisms 18a to 22a, respectively. The substrate lifting mechanisms 18a to 22a are configured to be liftable and hold a plurality of wafers W that forms a lot side by side in a vertical posture.

In addition, the plurality of held wafers W is immersed in the processing liquid in the processing tanks 18 to 22 by the substrate lifting mechanisms 18a to 22a. Further, the plurality of held wafers W are exposed to a processing gas for drying in the processing tank 23 by the substrate lifting mechanism 23a. Further, the substrate holder 17c is exposed to a processing liquid for cleaning and a drying gas in the processing tank 24.

Details of the processing of the wafer W using the processing tanks 18 to 23 will be described later. The number of the processing tanks 18 to 24 is not limited to the example in FIG. 1.

The controller 7 controls the operations of respective units of the substrate processing apparatus 1 (the carrier loading/unloading unit 2, the lot forming unit 3, the lot placing unit 4, the lot transfer unit 5, the lot processing unit 6, etc.). The controller 7 controls the operations of respective units of the substrate processing apparatus 1 based on signals from switches, various sensors, etc.

The controller 7 is, for example, a computer and has a computer-readable storage medium 8. The storage medium 8 stores programs that control various processes executed in the substrate processing apparatus 1.

The controller 7 controls the operation of the substrate processing apparatus 1 by reading and executing the program stored in the storage medium 8. Further, the program is stored in the storage medium 8 that is readable by a computer and may be installed in the storage medium 8 of the controller 7 from another storage medium.

Examples of the storage medium 8 that is readable by a computer include a hard disk (HD), a flexible disk (FD), a compact disk (CD), a magneto-optical disk (MO), and a memory card.

<Configuration of Processing Tank for Etching>

Figure 2:
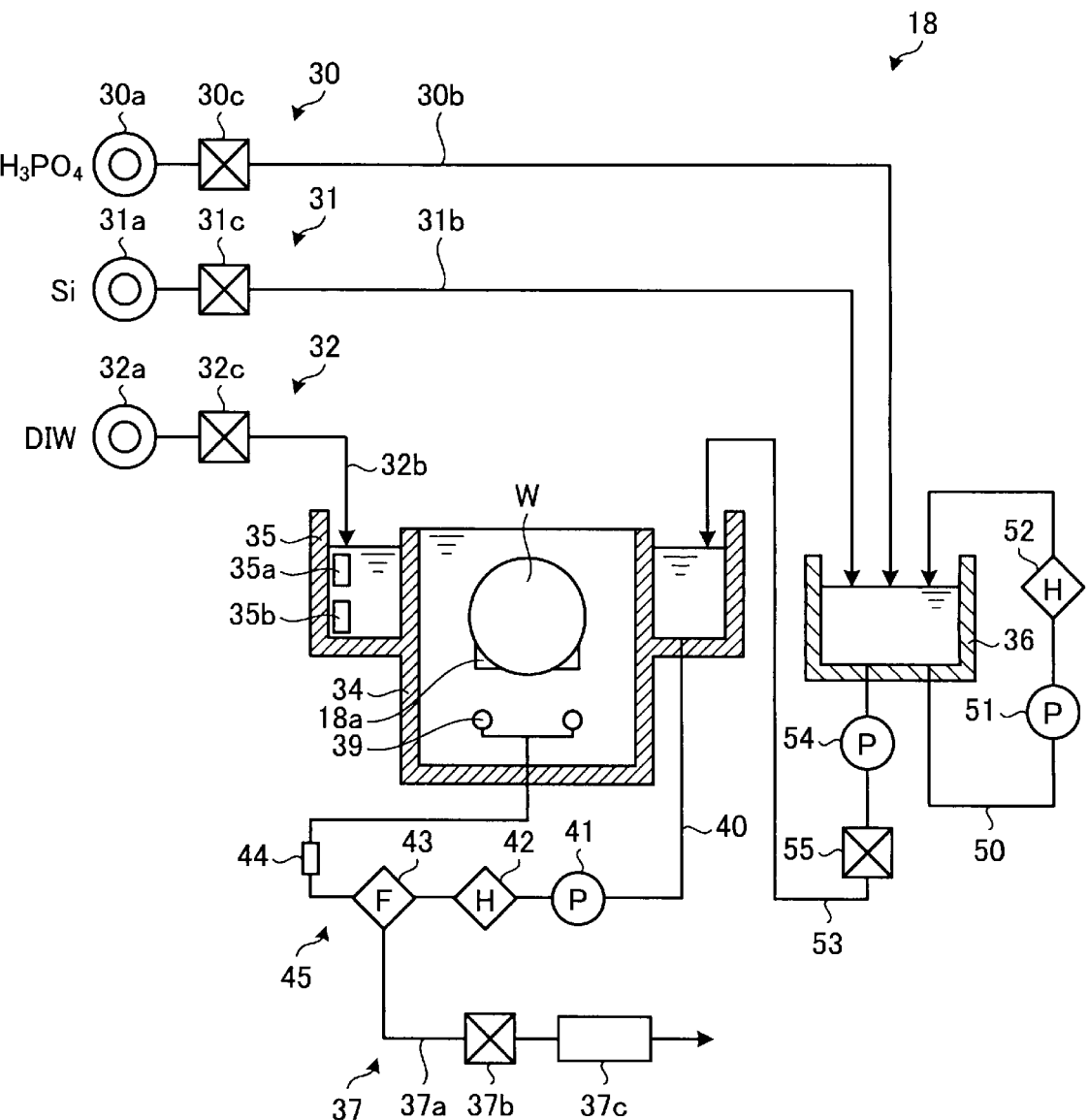
FIG. 2 is a schematic block diagram illustrating a configuration of a processing tank for etching according to the embodiment.

Next, the processing tank 18 for etching will be described with reference to FIG. 2. FIG. 2 is a schematic block diagram illustrating a configuration of a processing tank for etching 18 according to the embodiment.

In the processing tank 18, the silicon nitride film is selectively etched among the silicon nitride film (SiN) and the silicon oxide film ($SiO_2$) formed on the wafer W using a predetermined etching liquid.

In such an etching process of a silicon nitride film, a phosphoric acid processing liquid in which a silicon (Si)-containing compound is added to a phosphoric acid ($H_3PO_4$) aqueous solution to adjust the silicon concentration is used as an etching liquid.

The etching liquid may further contain an additive that suppresses re-deposition of silicon oxide R (see, e.g., FIG. 4B) during the etching process.

As a method of adjusting the silicon concentration of the etching liquid, a method of dissolving a silicon by immersing a dummy substrate in a phosphoric acid aqueous solution (seasoning) or a method of dissolving a silicon-containing compound such as colloidal silica in a phosphoric acid aqueous solution may be used. Further, the silicon concentration may be adjusted by adding a silicon-containing compound aqueous solution to the phosphoric acid aqueous solution.

The processing tank for etching 18 includes a phosphoric acid aqueous solution supply 30, a silicon supply 31, a DIW supply 32, an inner tank 34, an outer tank 35, a temperature control tank 36, and an etching liquid discharge 37.

The phosphoric acid aqueous solution supply 30 includes a phosphoric acid aqueous solution supply source 30a, a phosphoric acid aqueous solution supply line 30b, and a flow rate regulator 30c.

The phosphoric acid aqueous solution supply source 30a supplies a phosphoric acid aqueous solution whose phosphoric acid concentration is concentrated to a desired concentration. The phosphoric acid aqueous solution supply line 30b connects the phosphoric acid aqueous solution supply source 30a and the temperature control tank 36, and supplies the phosphoric acid aqueous solution to the temperature control tank 36 from the phosphoric acid aqueous solution supply source 30a.

The flow rate regulator 30c is provided in the phosphoric acid aqueous solution supply line 30b and adjusts a supply amount of the phosphoric acid aqueous solution supplied to the temperature control tank 36. The flow rate regulator 30c includes an on-off valve, a flow rate control valve, a flow meter, and the like.

The silicon supply 31 includes a silicon supply source 31a, a silicon supply line 31b, and a flow rate regulator 31c.

The silicon supply source 31a is a tank that stores a silicon-containing compound aqueous solution. The silicon supply line 31b connects the silicon supply source 31a and the temperature control tank 36, and supplies the silicon-containing compound aqueous solution from the silicon supply source 31a to the temperature control tank 36.

The flow rate regulator 31c is provided in the silicon supply line 31b and adjusts a supply amount of the silicon-containing compound aqueous solution supplied to the temperature control tank 36. The flow rate regulator 31c includes an on-off valve, a flow rate control valve, a flow meter, and the like. The silicon concentration of the etching liquid is adjusted by adjusting the supply amount of the silicon-containing compound aqueous solution by the flow rate regulator 31c.

Further, the silicon supply 31 may be configured to be able to supply the silicon-containing compound aqueous solution to the outer tank 35. Thus, the silicon supply 31 may directly adjust the silicon concentration of the etching liquid when the silicon concentration of the etching liquid decreases during the etching process.

The DIW supply 32 includes a DIW supply source 32a, a DIW supply line 32b, and a flow rate regulator 32c. The DIW supply 32 supplies DIW (DeIonized Water) to the outer tank 35 in order to replenish the moisture evaporated by heating the etching liquid.

The DIW supply line 32b connects the DIW supply source 32a and the outer tank 35, and supplies DIW at a predetermined temperature from the DIW supply source 32a to the outer tank 35.

The flow rate regulator 32c is provided in the DIW supply line 32b and adjusts the supply amount of DIW supplied to the outer tank 35. The flow rate regulator 32c includes an on-off valve, a flow rate control valve, a flow meter, and the like. The supply amount of DIW is adjusted by the flow rate regulator 32c, so that the temperature, phosphoric acid concentration, and silicon concentration of the etching liquid are adjusted.

The upper part of the inner tank 34 is opened, and the etching liquid is supplied to the vicinity of the upper part. In such an inner tank 34, the plurality of wafers W is immersed in the etching liquid by the substrate lifting mechanism 18a, and an etching process is performed on the wafers W.

The outer tank 35 is provided around the upper part of the inner tank 34 and the upper part is opened. The etching liquid that overflows from the inner tank 34 flows into the outer tank 35. In addition, a preliminary liquid is supplied from the temperature control tank 36 to the outer tank 35, and DIW is supplied from the DIW supply 32.

The outer tank 35 is provided with a temperature sensor 35a and a phosphoric acid concentration sensor 35b. The temperature sensor 35a detects the temperature of the etching liquid, and the phosphoric acid concentration sensor 35b detects the phosphoric acid concentration of the etching liquid. Signals generated by the temperature sensor 35a and the phosphoric acid concentration sensor 35b are transmitted to the controller 7 (see, e.g., FIG. 1).

The outer tank 35 and the inner tank 34 are connected by a circulation line 40. One end of the circulation line 40 is connected to the outer tank 35, and the other end of the circulation line 40 is connected to a processing liquid supply nozzle 39 provided within the inner tank 34.

In the circulation line 40, a pump 41, a heater 42, a filter 43, and a silicon concentration sensor 44 are provided in this order from the outer tank 35 side.

The pump 41 forms a circulating flow of the etching liquid sent from the outer tank 35 to the inner tank 34 through the circulation line 40. Further, the etching liquid overflows from the inner tank 34 and then flows out to the outer tank 35 again. In this way, a circulation path 45 of the etching liquid is formed. That is, the circulation path 45 is formed by the outer tank 35, the circulation line 40, and the inner tank 34.

The heater 42 adjusts the temperature of the etching liquid circulating in the circulation line 40. In the circulation path 45, the outer tank 35 is provided upstream of the heater 42 taking the inner tank 34 as a reference.

The filter 43 filters the etching liquid circulating in the circulation line 40. The silicon concentration sensor 44 detects the silicon concentration of the etching liquid circulating through the circulation line 40. Signals generated by the silicon concentration sensor 44 are transmitted to the controller 7.

In the temperature control tank 36, for example, when all the etching liquids in the inner tank 34 and the outer tank 35 are replaced, a preliminary liquid in which a phosphoric acid aqueous solution and a silicon-containing compound aqueous solution are mixed is generated and stored. Further, in the temperature control tank 36, for example, when a part of the etching liquid is replaced during the etching process, an aqueous phosphoric acid solution is stored as a preliminary liquid.

A circulation line 50 is connected to the temperature adjustment tank 36 to circulate the preliminary liquid in the temperature adjustment tank 36. The circulation line 50 is provided with a pump 51 and a heater 52. The pump 51 forms a circulating flow of the preliminary liquid that returns from the temperature control tank 36 to the temperature control tank 36 through the circulation line 50. The heater 52 adjusts the temperature of the preliminary liquid circulating in the circulation line 50.

In addition, one end of a supply line 53 is connected to the temperature control tank 36. The other end of the supply line 53 is connected to the outer tank 35. The supply line 53 is provided with a pump 54 and a flow rate regulator 55.

The pump 54 causes the preliminary liquid to flow from the temperature control tank 36 to the outer tank 35. The flow rate regulator 55 adjusts a supply amount of the preliminary liquid supplied to the outer tank 35. The flow rate regulator 55 includes an on-off valve, a flow rate control valve, a flow meter, and the like. The supply amount of the preliminary liquid is adjusted by the flow rate adjuster 55, so that the temperature, phosphoric acid concentration, and silicon concentration of the etching liquid are adjusted.

The etching liquid discharge 37 discharges the etching liquid when replacing all or a part of the etching liquid used in the etching process. The etching liquid discharge 37 includes a discharge line 37a, a flow rate regulator 37b, and a cooling tank 37c.

The discharge line 37a is connected to the circulation line 40. The flow rate regulator 37b is provided in the discharge line 37a to adjust the discharge amount of the discharged etching liquid. The flow rate regulator 37b includes an on-off valve, a flow rate control valve, a flow meter, and the like.

The cooling tank 37c temporarily stores and cools the etching liquid flowing through the discharge line 37a. In the cooling tank 37c, the discharge amount of the etching liquid is adjusted by the flow rate regulator 37b.

<Outline of Etching Process>

Figure 3A:
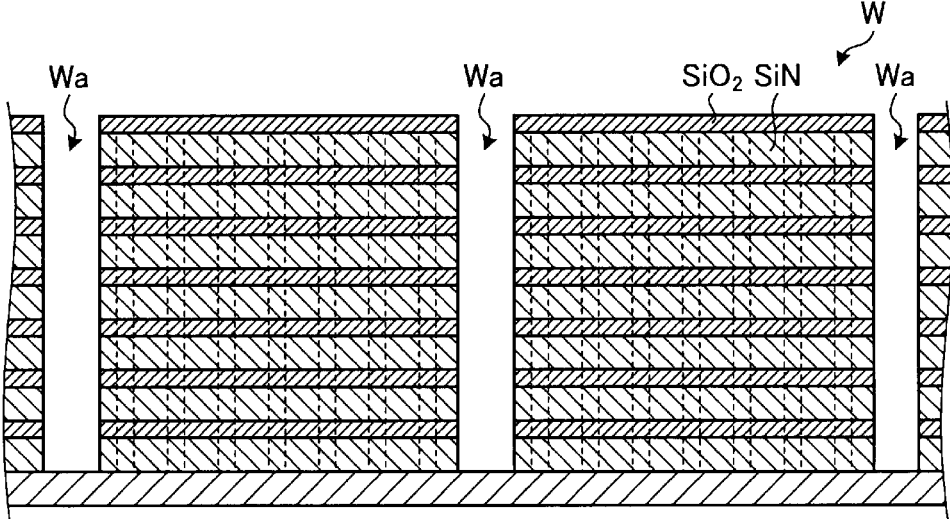
FIG. 3A is a schematic diagram illustrating a cross section of a wafer before performing an etching process.
Figure 3B:
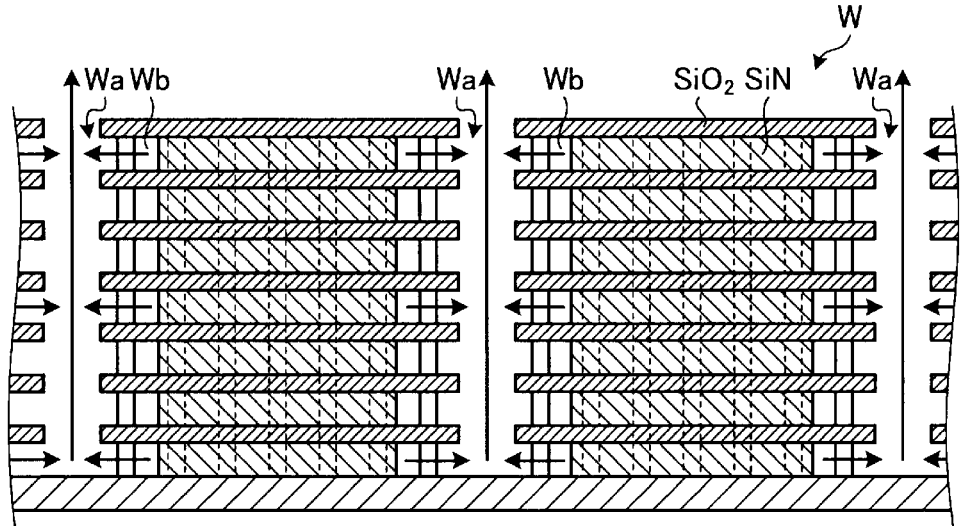
FIG. 3B is a schematic diagram illustrating a state of a wafer that has undergone an etching process.
Figure 3C:
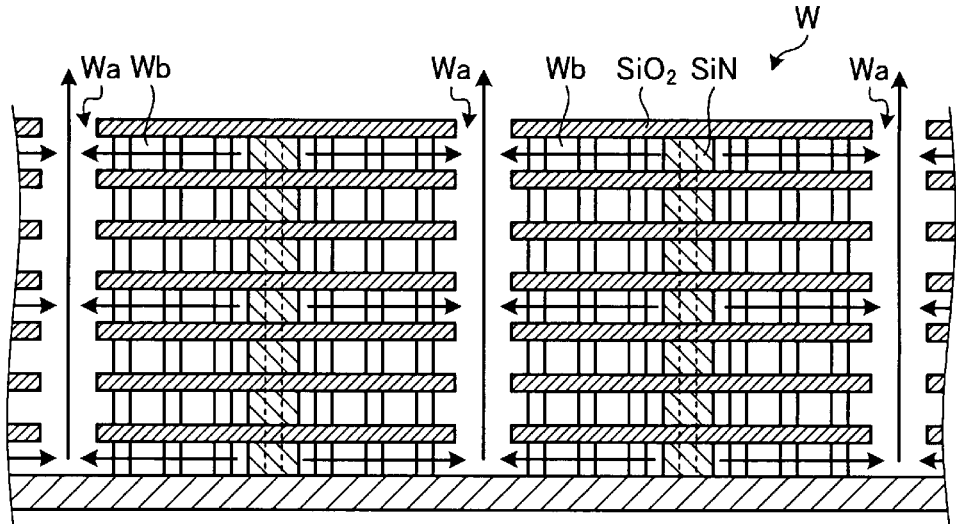
FIG. 3C is a schematic diagram illustrating a state of a wafer that has been further etched.
Figure 3D:
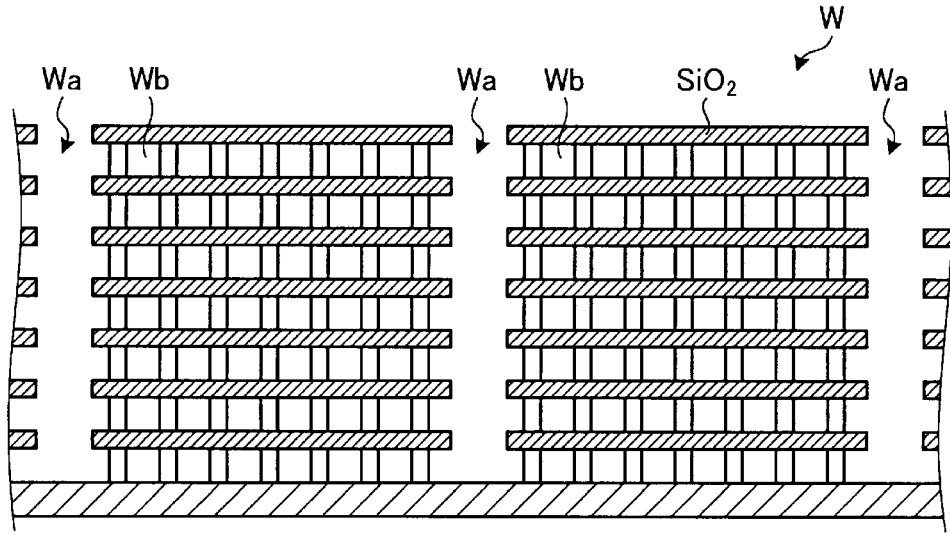
FIG. 3D is a schematic diagram illustrating a state of a wafer after the etching process is completed.

Next, an etching process according to the embodiment will be described with reference to FIGS. 3A to 3D. FIG. 3A is a schematic diagram illustrating a cross section of a wafer W before performing an etching process. FIG. 3B is a schematic diagram illustrating a state of a wafer W that has undergone an etching process. FIG. 3C is a schematic diagram illustrating a state of a wafer W that has been further etched. FIG. 3D is a schematic diagram illustrating a state of a wafer W after the etching process is completed.

As illustrated in FIG. 3A, a plurality of silicon nitride films SiN and silicon oxide films $SiO_2$ are alternately stacked on the wafer W before the etching process. In addition, a plurality of grooves Wa into which an etching liquid enters to etch the stacked silicon nitride films SiN is formed in the wafer W.

When the wafer W is immersed in the inner tank 34 (see, e.g., FIG. 2) and the etching process is started, as illustrated in FIG. 3B, the silicon nitride film SiN in the vicinity of a groove Wa is first etched. That is, in the etching process, an etching is sequentially performed from the silicon nitride film SiN close to the groove Wa.

The components of the silicon nitride film SiN eluted into the etching liquid by etching are discharged from a gap Wb formed by etching the silicon nitride film SiN to the groove Wa, and are discharged from the groove Wa to the outside of the wafer W. Then, the etching of the silicon nitride film SiN proceeds by replacing the etching liquid in the groove Wa and the gap Wb with a new etching liquid.

Therefore, as the etching process proceeds, as illustrated in FIG. 3C, a distance from the etched portion to the groove Wa increases. That is, the distance over which the components of the silicon nitride film SiN eluted into the etching liquid are discharged to the outside of the wafer W is increased.

Therefore, when an etching rate of the silicon nitride film SiN is high, the silicon concentration contained in the etching liquid in the groove Wa and the gap Wb increases. In particular, the silicon concentration of the etching liquid becomes higher in the gap Wb at the bottom of the groove Wa formed at the back side of the groove Wa, that is, at a position where the distance from the surface of the wafer W is long.

Therefore, the silicon oxide R (see, e.g., FIG. 4B) may be deposited on the surface of the silicon oxide film $SiO_2$ while the etching liquid containing the silicon nitride film SiN components that have been etched and eluted is discharged out of the wafer W. Further, as the etching process further proceeds, the gaps Wb on both sides communicate with each other, as illustrated in FIG. 3D.

<Details of Etching Process>

Figure 4A:
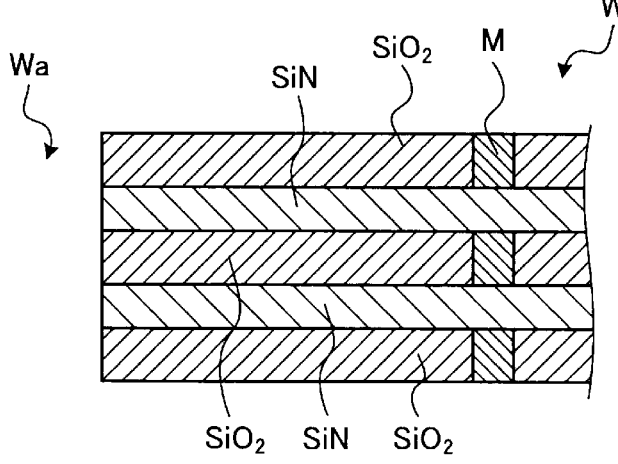
FIG. 4A is an enlarged cross-sectional view of the vicinity of a groove of a wafer before an etching process according to the embodiment.

Next, details of an etching process according to the embodiment will be described with reference to FIGS. 4A to 13. FIG. 4A is an enlarged cross-sectional view of the vicinity of a groove Wa of a wafer W before the etching process according to the embodiment.

As illustrated in FIG. 4A, a plurality of silicon nitride films SiN and silicon oxide films $SiO_2$ are alternately stacked on the wafer W before the etching process. Further, the grooves Wa are formed in the wafer W.

In addition, a memory hole M is formed at a predetermined location in the silicon oxide film $SiO_2$, and the memory hole M is filled with a block oxide film. The memory hole M is a hole provided to three-dimensionally arrange a plurality of memory cells.

Figure 4B:
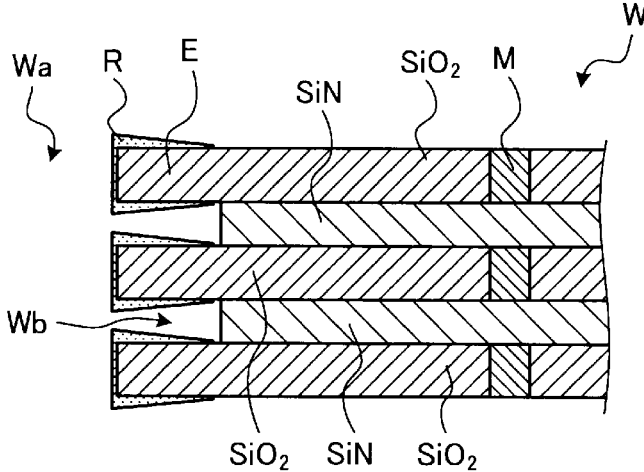
FIG. 4B is an enlarged cross-sectional view of the vicinity of a groove of a wafer after a first etching process according to the embodiment.

In the etching process of the embodiment, a first etching process using the above-described phosphoric acid processing liquid is first performed. FIG. 4B is an enlarged cross-sectional view of the vicinity of a groove Wa of a wafer W after the first etching process according to the embodiment. As illustrated in FIG. 4B, in the first etching process, the silicon nitride film SiN in the vicinity of the groove Wa is etched, and a gap Wb is formed in the vicinity of the groove Wa.

Further, in the first etching process, the above-described silicon oxide R is deposited on a tip portion E of the silicon oxide film $SiO_2$ exposed in the groove Wa and the gap Wb. Further, the above-described silicon oxide R may cause a pattern formed in the multilayer silicon oxide film $SiO_2$ not to have a desired shape.

For example, since the entrance of the gap Wb is blocked by the silicon oxide R, the etching liquid may not be supplied to the back side of the gap Wb, and therefore, the etching of the silicon nitride film SiN located on the back side of the gap Wb may not proceed.

Figure 4C:
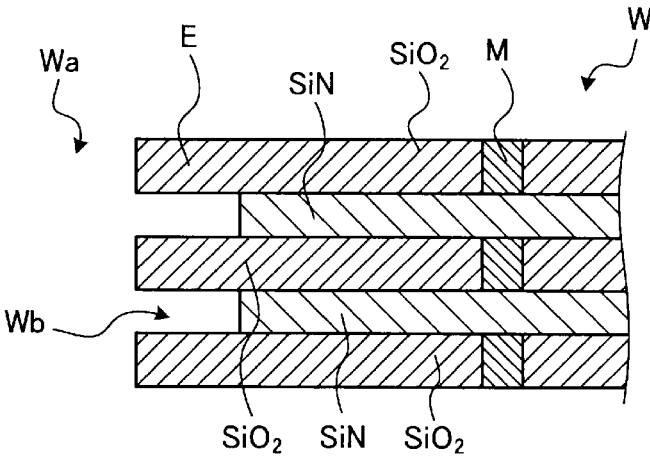
FIG. 4C is an enlarged cross-sectional view of the vicinity of a groove of a wafer after a processing step according to the embodiment.

Therefore, in the embodiment, the wafer W is subjected to the processing with the pattern shape processing liquid after the first etching process. FIG. 4C is an enlarged cross-sectional view of the vicinity of a groove Wa of a wafer W after the processing step according to the embodiment. As illustrated in FIG. 4C, in the processing step, the silicon oxide R deposited on the tip portion E of the silicon oxide film $SiO_2$ is etched with a pattern shape processing liquid.

The pattern shape processing liquid according to the embodiment is a processing liquid that may etch the silicon oxide R and the silicon oxide film $SiO_2$ and has no etching ability or a low etching ability with respect to the silicon nitride film SiN. Thus, as illustrated in FIG. 4C, the shape of the silicon nitride film SiN may be maintained in the processing step.

The pattern shape processing liquid is, for example, diluted hydrofluoric acid (DHF) or SC1 (a mixed liquid of ammonia, hydrogen peroxide, and water). Further, the pattern shape processing liquid is not limited to DHF or SC1.

For example, in the phosphoric acid processing liquid having a high phosphoric acid concentration, since the etching selectivity between the silicon nitride film SiN and the silicon oxide film $SiO_2$ is reversed, the phosphoric acid processing liquid having a high phosphoric acid concentration may be used as the pattern shape processing liquid.

Figure 4D:
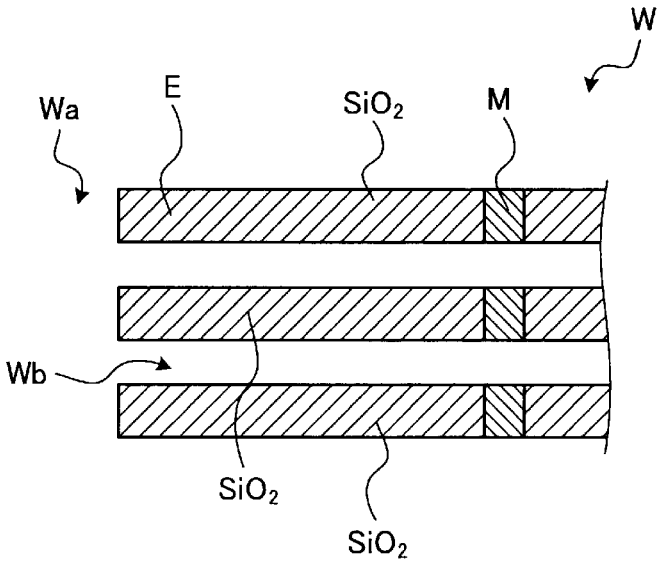
FIG. 4D is an enlarged cross-sectional view of the vicinity of a groove of a wafer after a second etching process according to the embodiment.

In the embodiment, a second etching process using a phosphoric acid processing liquid is performed after the processing step. FIG. 4D is an enlarged cross-sectional view of the vicinity of a groove Wa of a wafer W after the second etching process according to the embodiment. As illustrated in FIG. 4D, in the second etching process, all the silicon nitride films SiN are etched.

Further, in the second etching process of the embodiment, as illustrated in FIG. 4D, the silicon oxide R is hardly deposited on the surface of the silicon oxide film $SiO_2$, unlike the first etching process described above. The reason will be described below.

Figure 5:
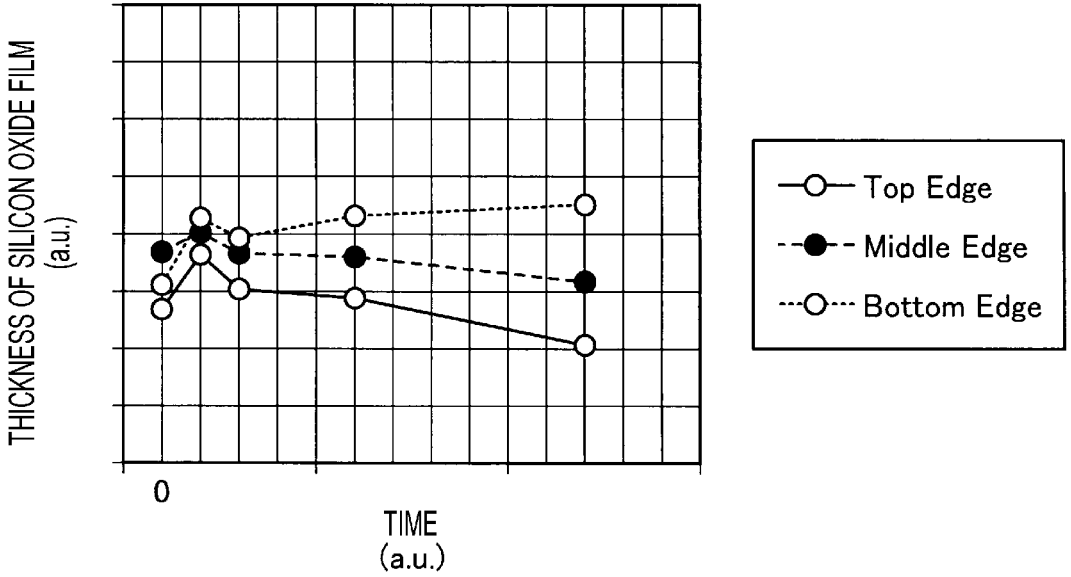
FIG. 5 is a diagram illustrating an example of transition of the thickness of an silicon oxide film when an etching is performed with a phosphoric acid processing liquid having a relatively high silicon concentration.

FIG. 5 is a diagram illustrating an example of transition of the thickness of a silicon oxide film $SiO_2$ when an etching is performed with a phosphoric acid processing liquid having a relatively high silicon concentration. From this result, it is observed that when an etching is performed with an etching liquid having a relatively high silicon concentration, the silicon oxide R is surely deposited on the surface of the silicon oxide film $SiO_2$ in the initial stage, and the thickness of the silicon oxide film $SiO_2$ increases.

Meanwhile, it has been clarified that after the initial stage of the etching process, the increase in the thickness of the silicon oxide film $SiO_2$ is suppressed even when the silicon concentration is relatively high. That is, it has been clarified that the phenomenon in which the silicon oxide R is deposited on the surface of the silicon oxide film $SiO_2$ is suppressed after the initial stage of the etching process (i.e., the stage in which the first etching process is performed).

This result is considered because the following phenomenon occurs in the wafer W. In the initial stage of the etching process, since the etching amount of the silicon nitride film SiN with respect to a volume of the groove Wa is large, the silicon concentration inside the groove Wa (particularly, below the groove Wa) tends to increase. Therefore, in the initial stage of the etching process, a phenomenon occurs in which the silicon oxide R is deposited on the surface of the silicon oxide film $SiO_2$.

Meanwhile, after the initial stage of the etching process, since the volume of the groove Wa increases due to the formation of the gap Wb, while the etching amount of the silicon nitride film SiN does not much vary from the initial stage, the silicon concentration in the groove Wa is relatively lowered. Therefore, it is considered that the phenomenon in which the silicon oxide R is deposited on the surface of the silicon oxide film $SiO_2$ is settled after the initial stage of the etching process.

By the etching process described so far, in the embodiment, a good pattern shape of the silicon oxide film $SiO_2$ may be obtained even on the wafer W in which the silicon nitride film SiN and the silicon oxide film $SiO_2$ are highly stacked.

As illustrated in FIG. 4B, the first etching process of the embodiment may be preferably performed so that the memory hole M formed in the silicon oxide film $SiO_2$ is not exposed from the gap Wb. For example, in the embodiment, the first etching process may be performed until the tip portion E of the silicon oxide film $SiO_2$ is exposed, and the exposed tip portion E may be processed by the processing step.

Thus, it is possible to prevent the block oxide film filling the memory hole M from being erroneously etched in the processing step after the first etching process.

Figure 6A:
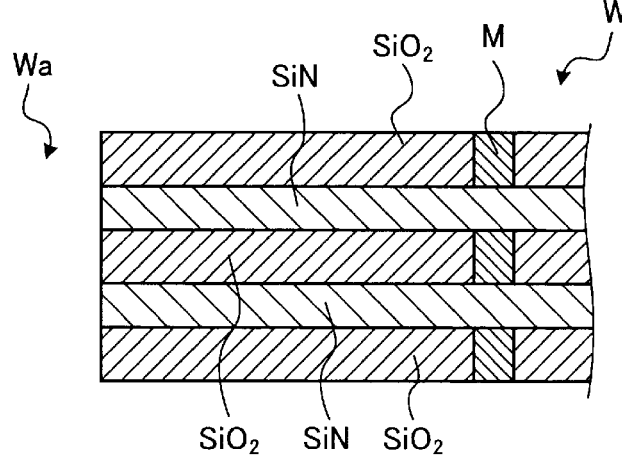
FIG. 6A is an enlarged cross-sectional view of the vicinity of a groove of a wafer before an etching process according to Modification 1 of the embodiment.

Next, various modifications of the etching process according to the embodiment will be described. FIG. 6A is an enlarged cross-sectional view of the vicinity of a groove Wa of a wafer W before an etching process according to Modification 1 of the embodiment. As illustrated in FIG. 6A, a plurality of silicon nitride films SiN and silicon oxide films $SiO_2$ are alternately stacked on the wafer W before the etching process.

Figure 6B:
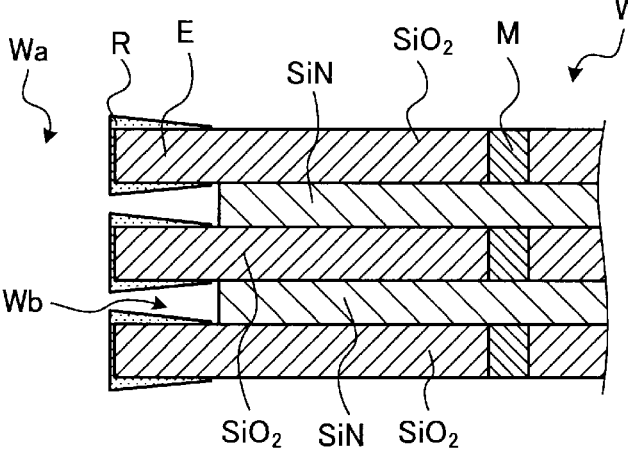
FIG. 6B is an enlarged cross-sectional view of the vicinity of a groove of a wafer after a first etching process according to Modification 1 of the embodiment.

Further, in Modification 1, similarly to the above-described embodiment, the first etching process is first performed using the phosphoric acid processing liquid. FIG. 6A is an enlarged cross-sectional view of the vicinity of a groove Wa of a wafer W after the first etching process according to Modification 1 of the embodiment. As illustrated in FIG. 6B, in the first etching process, a gap Wb is formed in the vicinity of the groove Wa, and the silicon oxide R is deposited on the tip portion E of the silicon oxide film $SiO_2$.

Next, in Modification 1, the processing step by a pattern shape processing liquid is performed. FIG. 6A is an enlarged cross-sectional view of the vicinity of the groove Wa of the wafer W after the processing step according to Modification 1 of the embodiment.

Figure 6C:
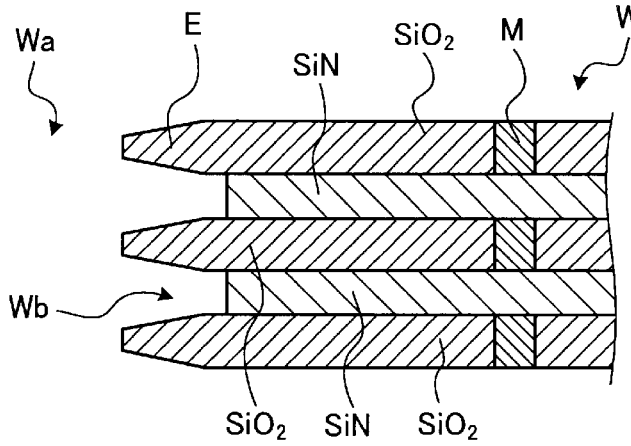
FIG. 6C is an enlarged cross-sectional view of the vicinity of a groove of a wafer after a processing step according to Modification 1 of the embodiment.

Here, in the processing step of Modification 1, as illustrated in FIG. 6C, in addition to the silicon oxide R deposited on the tip portion E of the silicon oxide film $SiO_2$, the tip portion E itself of the silicon oxide film $SiO_2$ is also etched. As a result, since the entrance of the gap Wb is widened, it is possible to effectively suppress the entrance of the gap Wb from being blocked by the silicon oxide R in the subsequent second etching process.

For example, in Modification 1, the processing time by the pattern shape processing liquid may be made longer than in the above-described embodiment. Further, in Modification 1, the etching may be performed with the pattern shape processing liquid having a higher etching rate than the embodiment.

Figure 6D:
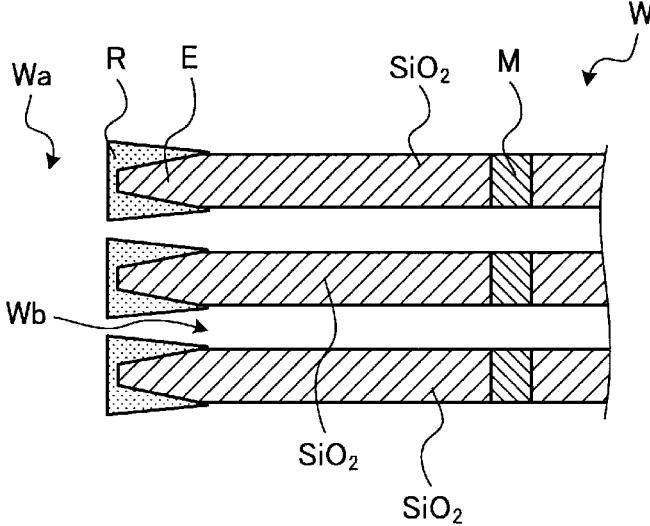
FIG. 6D is an enlarged cross-sectional view of the vicinity of a groove of a wafer after a second etching process according to Modification 1 of the embodiment.

Next, in Modification 1, the second etching process by a phosphoric acid processing liquid is performed. FIG. 6D is an enlarged cross-sectional view of the vicinity of a groove Wa of a wafer W after the second etching process according to Modification 1 of the embodiment. As illustrated in FIG. 6D, all the silicon nitride films SiN are etched in the second etching process of Modification 1.

FIG. 6D also illustrates a state in which the silicon oxide R is deposited again on the surface of the tip portion E of the silicon oxide film $SiO_2$. For example, when a phosphoric acid processing liquid having a high silicon concentration is used as the etching liquid, the silicon oxide R may be deposited on the silicon oxide film $SiO_2$ even in the second etching process after the initial stage of etching.

Figure 6E:
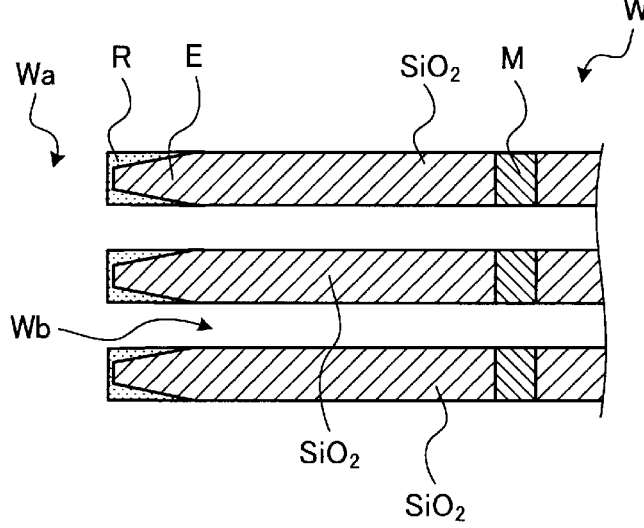
FIG. 6E is an enlarged cross-sectional view of the vicinity of a groove of a wafer after an additional processing step according to Modification 1 of the embodiment.

Therefore, in Modification 1, after the second etching process, an additional processing step using a pattern shape processing liquid is performed. FIG. 6E is an enlarged cross-sectional view of the vicinity of the groove Wa of the wafer W after the additional processing step according to Modification 1 of the embodiment.

As illustrated in FIG. 6E, at least a part of the silicon oxide R deposited on the surface of the tip portion E of the silicon oxide film $SiO_2$ is removed by the additional processing step. By the etching process described so far, in Modification 1, a good pattern shape of the silicon oxide film $SiO_2$ may be obtained even on the wafer W in which the silicon nitride film SiN and the silicon oxide film $SiO_2$ are highly stacked.

In addition, in the additional processing step of Modification 1, it is preferable to use a pattern shape processing liquid having a lower etching rate than that of the processing step. Thus, it is possible to suppress the block oxide film of the memory hole M exposed from the gap Wb from being erroneously etched in the additional processing step.

Further, in the additional processing step of Modification 1, it is preferable that only the silicon oxide R deposited on the surface of the tip portion E of the silicon oxide film $SiO_2$ is removed, and the silicon oxide film $SiO_2$ itself is not etched.

For example, the additional processing time is set to be equal to or shorter than the time required for removing the silicon oxide R. Thus, it is possible to suppress the pattern shape of the silicon oxide film $SiO_2$ from being etched excessively.

Further, in the additional processing step of Modification 1, the same type of pattern shape processing liquid as that of the processing step may be used, or a different type of pattern shape processing liquid may be used.

Figure 7A:
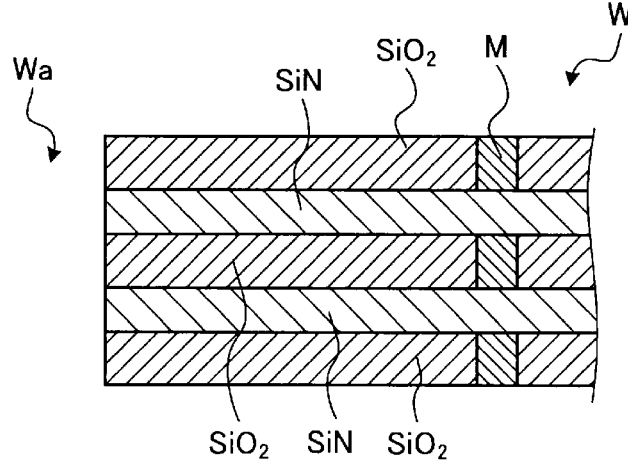
FIG. 7A is an enlarged cross-sectional view of the vicinity of a groove of a wafer before an etching process according to Modification 2 of the embodiment.

FIG. 7A is an enlarged cross-sectional view of the vicinity of a groove Wa of a wafer W before an etching process according to Modification 2 of the embodiment. As illustrated in FIG. 7A, a plurality of silicon nitride films SiN and silicon oxide films $SiO_2$ are alternately stacked on the wafer W before the etching process.

Figure 7B:
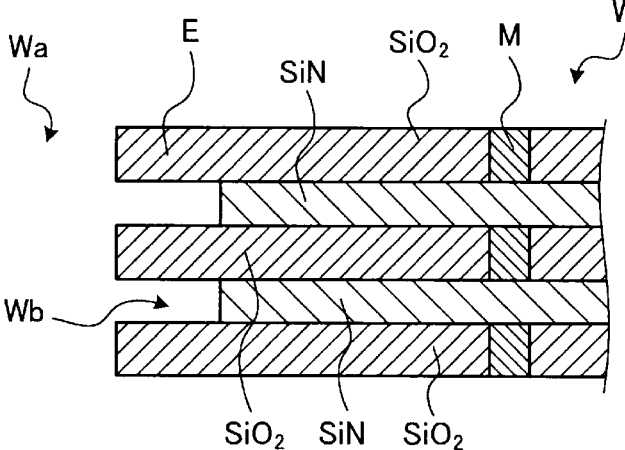
FIG. 7B is an enlarged cross-sectional view of the vicinity of a groove of a wafer after a first etching process according to Modification 2 of the embodiment.

Next, in Modification 2, the first etching process by a phosphoric acid processing liquid is first performed. FIG. 7B is an enlarged cross-sectional view of the vicinity of the groove Wa of the wafer W after the first etching process according to Modification 2 of the embodiment.

Here, as illustrated in FIG. 7B, the first etching process of Modification 2 is performed so that the silicon oxide R is not deposited on the tip portion E of the silicon oxide film $SiO_2$ by adjusting the components of the etching liquid.

For example, by using a phosphoric acid processing liquid having a low silicon concentration as the etching liquid, the first etching process may be performed so that the silicon oxide R is not deposited at the tip portion E.

Figure 7C:
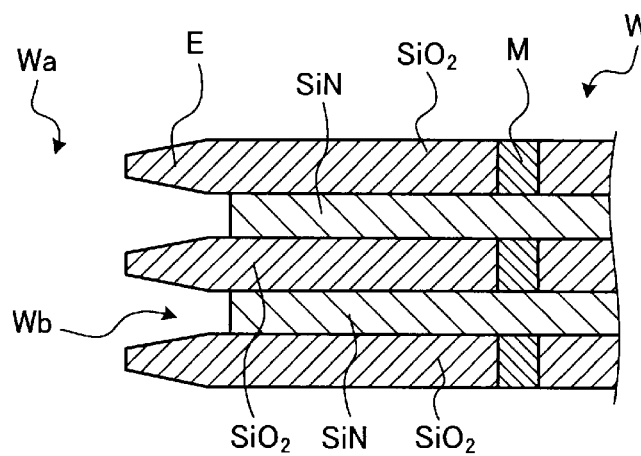
FIG. 7C is an enlarged cross-sectional view of the vicinity of a groove of a wafer after a processing step according to Modification 2 of the embodiment.

Next, in Modification 2, the processing step by a pattern shape process liquid is performed. FIG. 7C is an enlarged cross-sectional view of the vicinity of the groove Wa of the wafer W after the processing step according to Modification 2 of the embodiment. As illustrated in FIG. 7C, in the processing step of Modification 2, the tip portion E of the silicon oxide film $SiO_2$ is etched.

As a result, since an entrance of the gap Wb is widened, it is possible to effectively suppress the entrance of the gap Wb from being blocked by the silicon oxide R in the subsequent second etching process.

Figure 7D:
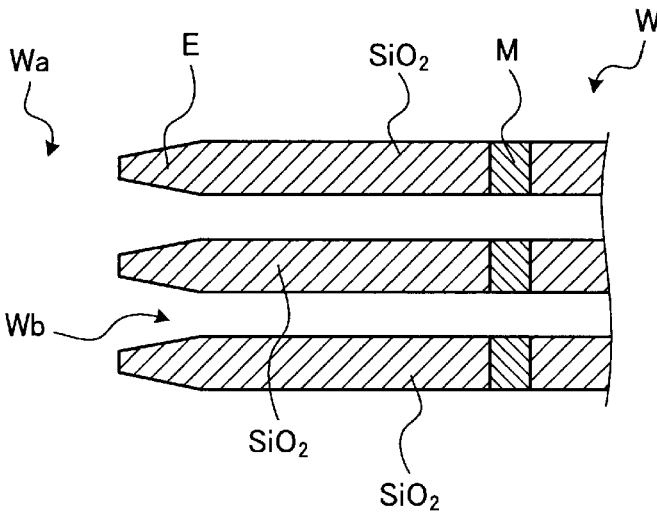
FIG. 7D is an enlarged cross-sectional view of the vicinity of a groove of a wafer after a second etching process according to Modification 2 of the embodiment.

Next, in Modification 2, the second etching process by a phosphoric acid processing liquid is performed. FIG. 7D is an enlarged cross-sectional view of the vicinity of the groove Wa of the wafer W after the second etching process according to Modification 2 of the embodiment. As illustrated in FIG. 7D, all the silicon nitride films SiN are etched in the second etching process of Modification 2.

By the etching process described so far, in Modification 2, a good pattern shape of the silicon oxide film $SiO_2$ may be obtained even on the wafer W in which the silicon nitride film SiN and the silicon oxide film $SiO_2$ are highly stacked.

Figure 8:
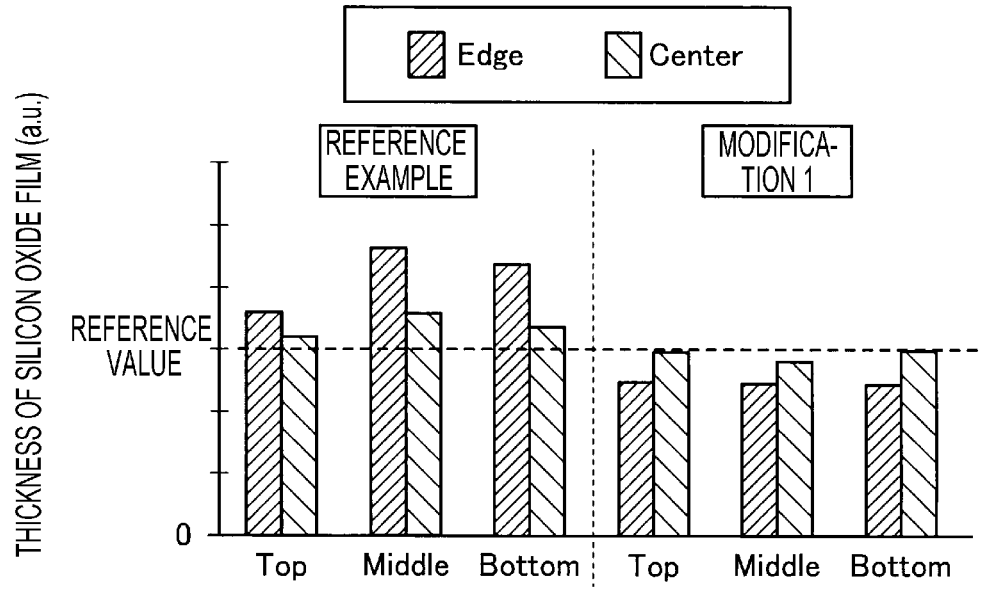
FIG. 8 is a view illustrating the thickness of a silicon oxide film after an etching process in Modification 1 and a reference example of the embodiment.

FIG. 8 is a view illustrating the thickness of a silicon oxide film $SiO_2$ after the etching process in Modification 1 and a reference example of the embodiment. Here, the reference example relates to the thickness of the silicon oxide film $SiO_2$ after being collectively etched with the same etching liquid (a temperature of 120° C., a silicon concentration of 0.1%).

Further, in Modification 1, the first etching process and the second etching process have been performed using the same etching liquid as the reference example (the processing time of the first etching process: the processing time of the second etching process=5:95).

In addition, a processing step has been performed between the first etching process and the second etching process, and an additional processing step has been performed after the second etching process. Further, the processing step is performed such that the silicon oxide R is etched by 5 nm with DHF of 0.2%, and the additional processing step is performed for 600 seconds with SC1 at a temperature of 65° C. (ammonia:hydrogen peroxide:water=1:2:50).

As illustrated in FIG. 8, in the reference example, the thickness of the silicon oxide film $SiO_2$ is increased from a reference value (an initial value of the thickness of the silicon oxide film $SiO_2$). In particular, since the thickness of the silicon oxide film $SiO_2$ is greatly increased at the tip portion (edge) of the center (middle) and bottom of the groove Wa, it may be seen that a good pattern shape of the silicon oxide film $SiO_2$ has not been obtained in the reference example.

Meanwhile, in Modification 1, the thickness of the silicon oxide film $SiO_2$ is close to or lower than the reference value in all regions. Therefore, it may be seen that in Modification 1, a good pattern shape of the silicon oxide film $SiO_2$ has been obtained.

Further, although not illustrated in FIG. 8, as in the embodiment and Modification 2, it may be seen that a good pattern shape of the silicon oxide film $SiO_2$ has been obtained as in Modification 1.

Figures 9A, 9B, 9C:
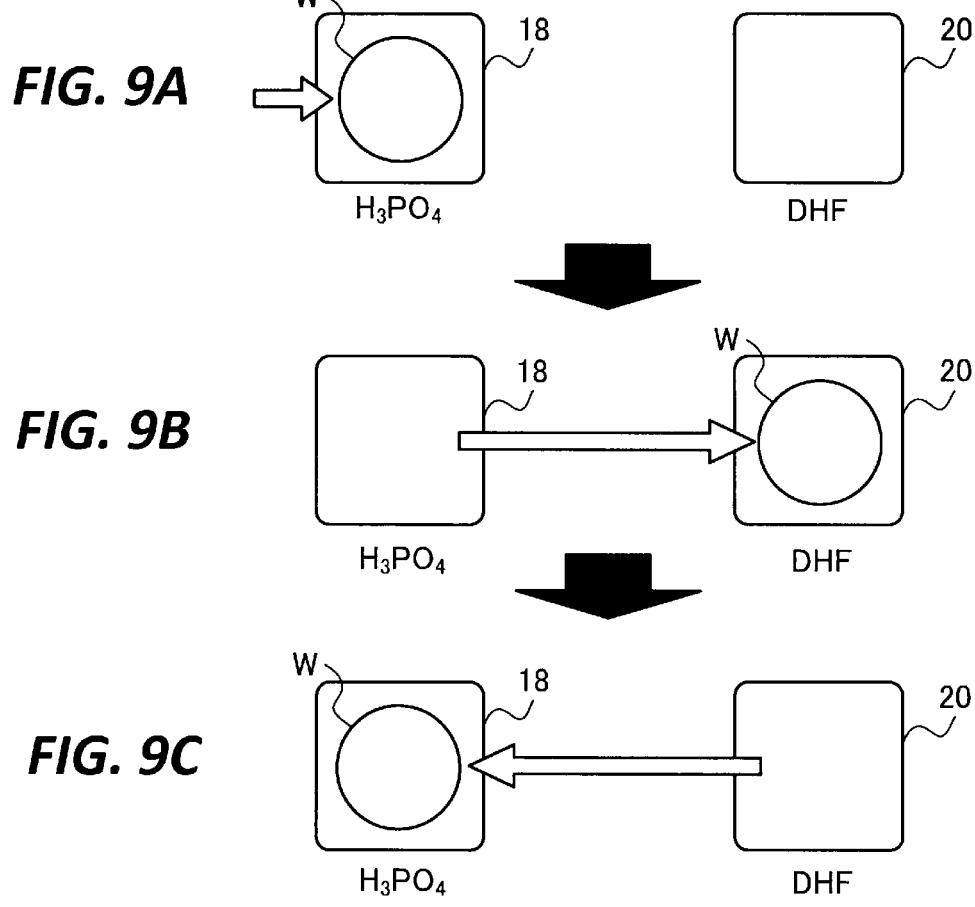
FIGS. 9A to 9C are views for explaining an etching process in the substrate processing apparatus according to the embodiment.

FIGS. 9A to 9C are views for explaining an etching process in the substrate processing apparatus 1 according to the embodiment. As illustrated in FIG. 9A, in the embodiment, one processing tank 18 and one processing tank 20 are prepared in the substrate processing apparatus 1.

The processing tank 18 stores a phosphoric acid processing liquid in which the silicon concentration and the phosphoric acid concentration are adjusted to predetermined concentrations as an etching liquid, and the processing tank 20 stores DHF adjusted to a predetermined concentration as a pattern shape processing liquid.

Then, as illustrated in FIG. 9A, the controller 7 transfers the wafer W to the processing tank 18 by the lot transfer unit 5 (see, e.g., FIG. 1), and performs the first etching process on the wafer W in the processing tank 18. Next, although not illustrated in FIGS. 9A to 9C, the controller 7 transfers the wafer W that has been subjected to the first etching process to the processing tank 19 by the lot transfer unit 5, and performs a rinsing process on the wafer W in the processing tank 19.

Next, as illustrated in FIG. 9B, the controller 7 transfers the wafer W that has been subjected to the first etching process and the rinsing process to the processing tank 20 by the lot transfer unit 5, and performs a processing step on the wafer W in the processing tank 20. Then, as illustrated in FIG. 9C, the controller 7 transfers the wafer W that has been subjected to the processing step to the processing tank 18 by the lot transfer unit 5, and performs a second etching process on the wafer W in the processing tank 18.

Although the subsequent process is not illustrated, the controller 7 transfers the wafer W that has been subjected to the second etching process to the processing tank 19 by the lot transfer unit 5, and performs a rinsing process on the wafer W in the processing tank 19. Then, the controller 7 transfers the rinsed wafer W to the processing tank 21 by the lot transfer unit 5 and performs a cleaning process on the wafer W in the processing tank 21.

Finally, the controller 7 transfers the wafer W that has been subjected to the cleaning process to the processing tank 22 by the lot transfer unit 5, and performs a rinsing process on the wafer W in the processing tank 22 to complete the etching process according to the embodiment. The wafer W that has been subjected to the etching process is transferred to the processing tank 23 and subjected to a drying process, and then transferred to the lot placing unit 4.

Figures 10A, 10B, 10C, 10D:
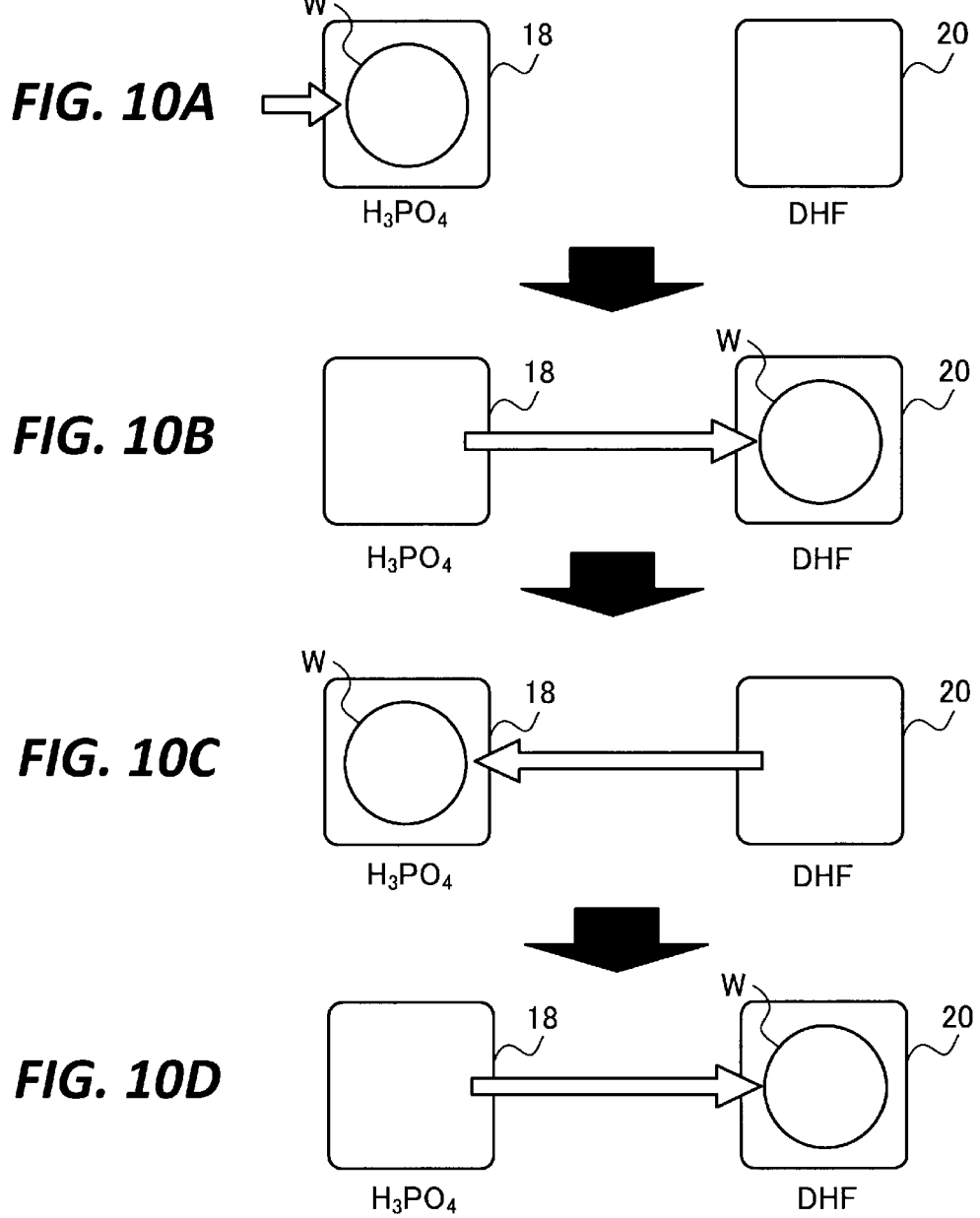
FIGS. 10A to 10D are views for explaining an etching process in the substrate processing apparatus according to Modification 1 of the embodiment.

FIGS. 10A to 10D are views for explaining an etching process in the substrate processing apparatus 1 according to Modification 1 of the embodiment. As illustrated in FIG. 10A, in Modification 1, one processing tank 18 and one processing tank 20 are prepared in the substrate processing apparatus 1.

The processing tank 18 stores a phosphoric acid processing liquid in which the silicon concentration and the phosphoric acid concentration are adjusted to predetermined concentrations as an etching liquid, and the processing tank 20 stores DHF adjusted to a predetermined concentration as a pattern shape processing liquid.

Then, as illustrated in FIG. 10A, the controller 7 transfers the wafer W to the processing tank 18 by the lot transfer unit 5 (see, e.g., FIG. 1), and performs the first etching process on the wafer W in the processing tank 18. Next, although not illustrated in FIGS. 10A to 10D, the controller 7 transfers the wafer W that has been subjected to the first etching process to the processing tank 19 by the lot transfer unit 5, and performs a rinsing process on the wafer W in the processing tank 19.

Next, as illustrated in FIG. 10B, the controller 7 transfers the wafer W that has been subjected to the first etching process and the rinsing process to the processing tank 20 by the lot transfer unit 5, and performs a processing step on the wafer W in the processing tank 20. Then, as illustrated in FIG. 10C, the controller 7 transfers the wafer W that has been subjected to the processing step to the processing tank 18 by the lot transfer unit 5, and performs the second etching process on the wafer W in the processing tank 18.

Next, although not illustrated in FIGS. 10A to 10D, the controller 7 transfers the wafer W that has been subjected to the second etching process to the processing tank 19 by the lot transfer unit 5, and performs a rinsing process on the wafer W in the processing tank 19. Next, as illustrated in FIG. 10D, the controller 7 transfers the wafer W that has been subjected to the second etching process and the rinsing process to the processing tank 20 by the lot transfer unit 5, and performs an additional processing step on the wafer W in the processing tank 20.

Although the subsequent process is not illustrated, the controller 7 transfers the wafer W that has been subjected to the additional processing step to the processing tank 21 by the lot transfer unit 5, and performs a cleaning process on the wafer W in the processing tank 21. Finally, the controller 7 transfers the wafer W that has been subjected to the cleaning process to the processing tank 22 by the lot transfer unit 5, and performs a rinsing process on the wafer W in the processing tank 22 to complete the etching process according to Modification 1.

Figures 11A, 11B, 11C:
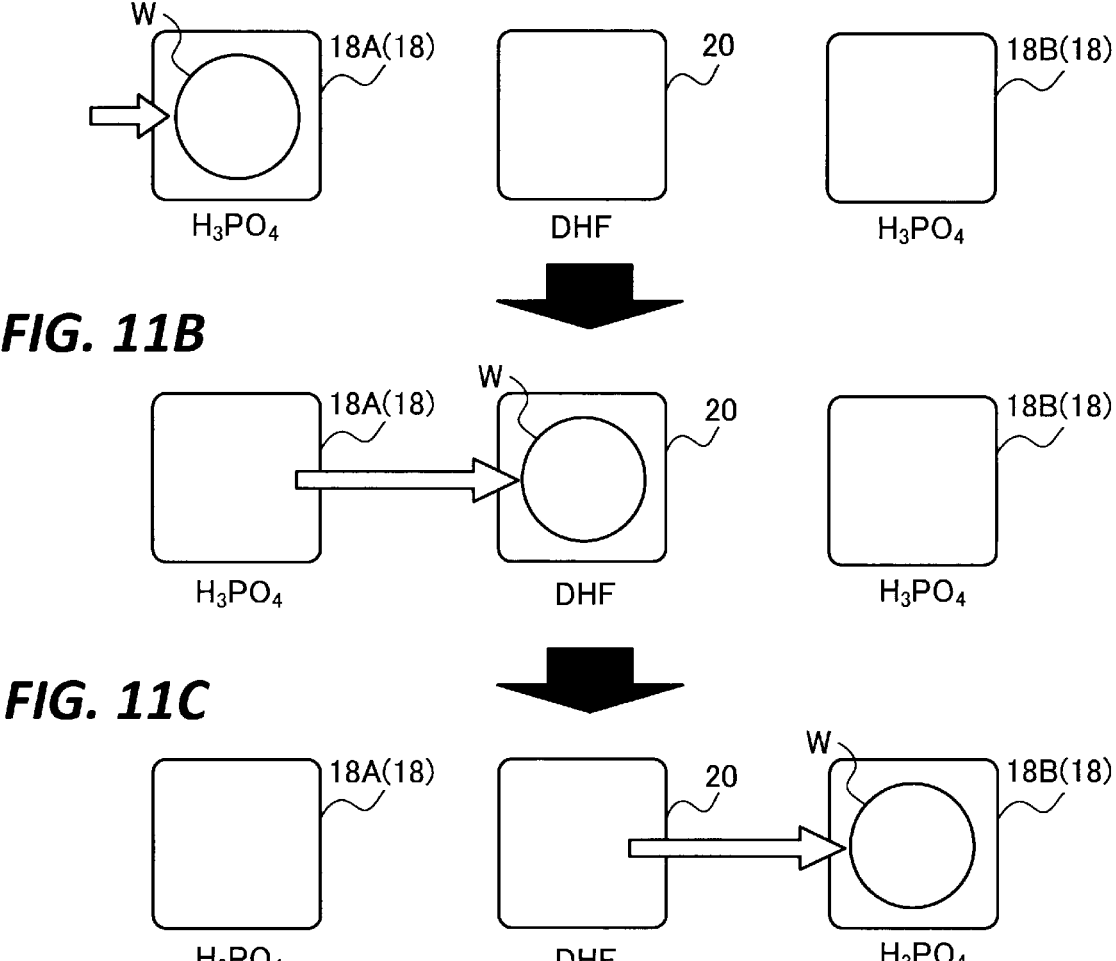
FIGS. 11A to 11C are views for explaining an etching process in the substrate processing apparatus according to Modification 2 of the embodiment.

FIGS. 11A to 11C are views for explaining an etching process in the substrate processing apparatus 1 according to Modification 2 of the embodiment. As illustrated in FIG. 11A, in Modification 2, the substrate processing apparatus 1 is provided with two processing tanks 18 (hereinafter, referred to as processing tanks 18A and 18B) and one processing tank 20.

The processing tank 18A stores a phosphoric acid processing liquid having a low silicon concentration as an etching liquid, and the processing tank 18B stores a phosphoric acid processing liquid having a higher silicon concentration than the processing tank 18A as an etching liquid. The processing tank 18A is an example of a first processing tank, and the processing tank 18B is an example of a third processing tank. Further, the processing tank 20 stores DHF adjusted to a predetermined concentration as a pattern shape processing liquid.

Then, as illustrated in FIG. 11A, the controller 7 transfers the wafer W to the processing tank 18 by the lot transfer unit 5 (see, e.g., FIG. 1), and performs the first etching process on the wafer W in the processing tank 18. Next, although not illustrated in FIGS. 11A to 11C, the controller 7 transfers the wafer W that has been subjected to the first etching process to the processing tank 19 by the lot transfer unit 5, and performs a rinsing process on the wafer W in the processing tank 19.

Next, as illustrated in FIG. 11B, the controller 7 transfers the wafer W that has been subjected to the first etching process and the rinsing process to the processing tank 20 by the lot transfer unit 5, and performs a processing step on the wafer W in the processing tank 20. Then, as illustrated in FIG. 11C, the controller 7 transfers the wafer W that has been subjected to the processing step to the processing tank 18 by the lot transfer unit 5, and performs the second etching process on the wafer W in the processing tank 18.

Although the subsequent process is not illustrated, the controller 7 transfers the wafer W that has been subjected to the second etching process to the processing tank 19 by the lot transfer unit 5, and performs a rinsing process on the wafer W in the processing tank 19. Then, the controller 7 transfers the rinsed wafer W to the processing tank 21 by the lot transfer unit 5 and performs a cleaning process on the wafer W in the processing tank 21.

Finally, the controller 7 transfers the wafer W that has been subjected to the cleaning process to the processing tank 22 by the lot transfer unit 5, and performs a rinsing process on the wafer W in the processing tank 22 to complete the etching process according to Modification 2.

In the example of FIGS. 11A to 11C, as described above, the silicon concentration of the etching liquid used for the first etching process may be set to be lower than the silicon concentration of the etching liquid used for the second etching process.

This may suppress the silicon oxide R from being deposited on the surface of the silicon oxide film $SiO_2$ during the first etching process.

Further, in the example of FIGS. 11A to 11C, the temperature of the etching liquid used for the first etching process may be set to be lower than the temperature of the etching liquid used for the second etching process. Thus, it is possible to suppress the local increase in silicon concentration by lowering the etching rate of SiN, and to suppress the deposition of silicon oxide R, which is likely to occur at the beginning of the first etching process.

That is, the temperature of the etching liquid used for the second etching process may be set to be lower than the temperature of the etching liquid used for the first etching process. Thus, the saturation concentration of silicon with respect to the etching liquid may be increased. Therefore, the silicon concentration of the etching liquid in the second etching process may be set to be higher than the silicon concentration of the etching liquid in the first etching process.

In addition, since the etching rate of the silicon nitride film SiN may be increased in the second etching process, the processing time of the second etching process may be reduced.

Further, in the example of FIGS. 11A to 11C, descriptions have been made on a case where two processing tanks 18 are used in the etching process of Modification 2. However, as in the embodiment and Modification 1, the etching process of Modification 2 may be performed using one processing tank 18.

In this case, the silicon concentration of the etching liquid stored in one processing tank 18 may be increased in the second etching process as compared with the first etching process. Further, in the second etching process, the temperature of the etching liquid stored in one processing tank 18 may be increased as compared with the first etching process.

In addition, not only in the case of Modification 2, but also in the embodiment and Modification 1, the silicon concentration of the etching liquid stored in one processing tank 18 in the second etching process may be increased as compared with the first etching process. Further, in the second etching process, the temperature of the etching liquid stored in one processing tank 18 may be increased as compared with the first etching process.

Further, in the example of FIGS. 11A to 11C, descriptions have been made on a case where the etching process is performed using two processing tanks 18, but the etching process may be performed using three or more processing tanks 18. FIGS. 12A to 12E are views for explaining an etching process in the substrate processing apparatus 1 according to Modification 3 of the embodiment.

Figure 12A:
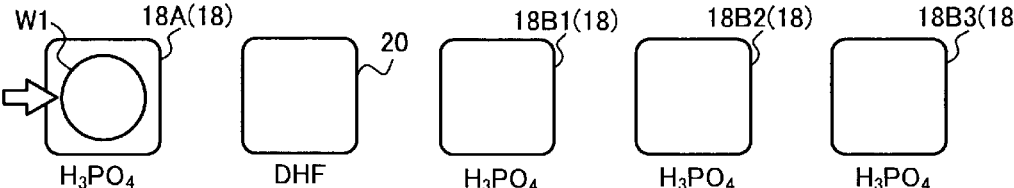
FIGS. 12A to 12E are views for explaining an etching process in the substrate processing apparatus according to Modification 3 of the embodiment.

As illustrated in FIG. 12A, in Modification 3, the substrate processing apparatus 1 is provided with two processing tanks 18 (hereinafter, referred to as processing tanks 18A and 18B) and one processing tank 20.

The processing tank 18A stores a phosphoric acid processing liquid having a low silicon concentration as an etching liquid, and processing tanks 18B1 to 18B3 store a phosphoric acid processing liquid having a higher silicon concentration than that of the processing tank 18A as an etching liquid. Further, the processing tank 20 stores DHF adjusted to a predetermined concentration as a pattern shape processing liquid.

Then, as illustrated in FIG. 12A, the controller 7 transfers a wafer W1 to the processing tank 18A by the lot transfer unit 5 (see, e.g., FIG. 1), and performs a first etching process on the wafer W1 in the processing tank 18A.

Figure 12B:
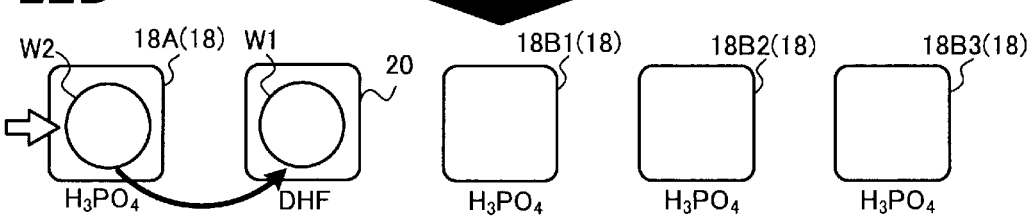

Next, the controller 7 transfers the wafer W1 from the processing tank 18A to the processing tank 19 (not illustrated) to perform a rinsing process on the wafer W1, and as illustrated in part FIG. 12B, transfers the wafer W1 to the processing tank 20 by the lot transfer unit 5 to perform a processing step on the wafer W1 in the processing tank 20.

At that time, the controller 7 transfers a wafer W2 of another lot to an empty processing tank 18A by the lot transfer unit 5, and performs the first etching process on the wafer W2 in the processing tank 18A.

Figure 12C:
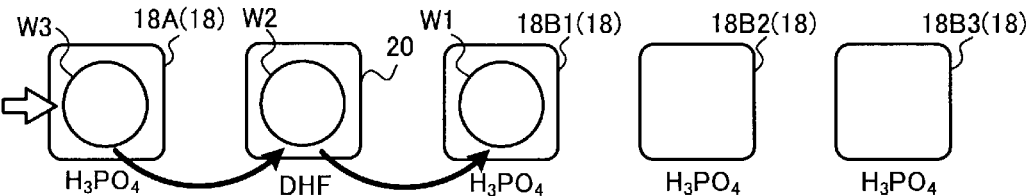

Next, as illustrated in FIG. 12C, the controller 7 transfers the wafer W1 to the processing tank 18B1 by the lot transfer unit 5, and performs the second etching process on the wafer W1 in the processing tank 18B1.

At that time, the controller 7 transfers the wafer W2 from the processing tank 18A to the processing tank 19 (not illustrated) by the lot transfer unit 5 to perform a rinsing process on the wafer W2, and then transfers the wafer W2 to the processing tank 20 by the lot transfer unit 5 to perform a processing step on the wafer W2 in the processing tank 20.

At that time, the controller 7 transfers a wafer W3 of another lot to the empty processing tank 18A by the lot transfer unit 5, and performs the first etching process on the wafer W3 in the processing tank 18A.

Here, the second etching process requires a longer time than the first etching process and the subsequent process (e.g., several times to several tens times as long as the first etching process). Therefore, when the first etching process and the processing step of the wafer W2 input later are completed, the second etching process of the wafer W1 input earlier is not completed yet.

Figure 12D:
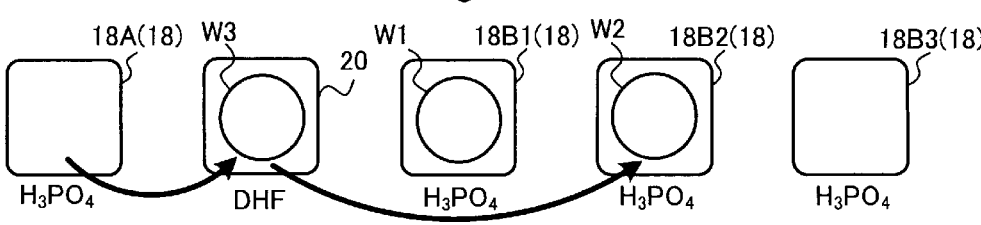

Therefore, in Modification 3, as illustrated in FIG. 12D, it is assumed that the wafer W2 after the first etching process and the processing step is transferred to another processing tank 18B2 by the lot transfer unit 5, and the second etching process is performed. Thus, the second etching process may be performed even on the wafer W2 that has been input later without waiting until the second etching process on the previously input wafer W1 is completed.

At that time, the controller 7 transfers a wafer W3 from the processing tank 18A to the processing tank 19 (not illustrated) by the lot transfer unit 5 to perform a rinsing process on the wafer W3, and then transfers the wafer W3 to the processing tank 20 by the lot transfer unit 5 to perform a processing step on the wafer W3 in such a processing tank 20.

Figure 12E:
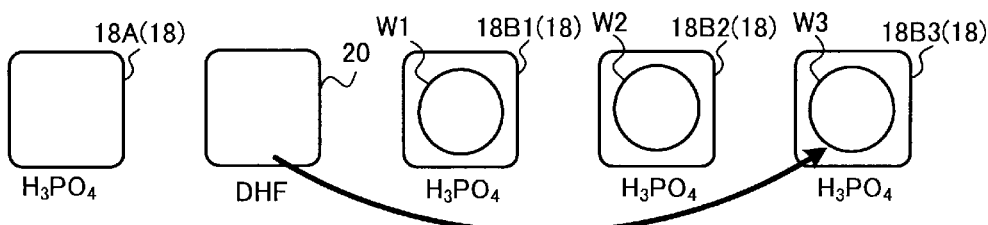

Next, as illustrated in FIG. 12E, the controller 7 transfers the wafer W3 from the processing tank 20 to another processing tank 18B3 by the lot transfer unit 20, and performs a second etching process on the wafer W3 in such a processing tank 18B3.

Thus, the second etching process may be performed even on the wafer W3 that has been input later without waiting until the second etching process on the previously input wafers W1 and W1 is completed. The subsequent process is the same as in the examples of FIGS. 9A to 11C, and descriptions thereof are omitted.

As described above, in Modification 3, more processing tanks 18 in which the second etching process is performed (processing tanks 18B1 to 18B3) are provided than the processing tanks 18 in which the first etching process is performed (processing tank 18A).

Thus, the second etching process may be performed even on the wafer W3 that has been input later without waiting until the second etching process on the previously input wafer W is completed. Therefore, according to Modification 3, the throughput of the etching process may be improved.

Further, although the example of FIGS. 12A to 12E represents an example in which three processing tanks 18B of performing the second etching process are provided, the number of processing tanks 18B of performing the second etching process is not limited to three.

In the embodiments and the various modifications described above, descriptions have been made on a case where the wafer W is subjected to the etching process by the batch process. However, the etching process of the embodiments and the various modifications may be performed by a single-wafer process.

Figure 13:
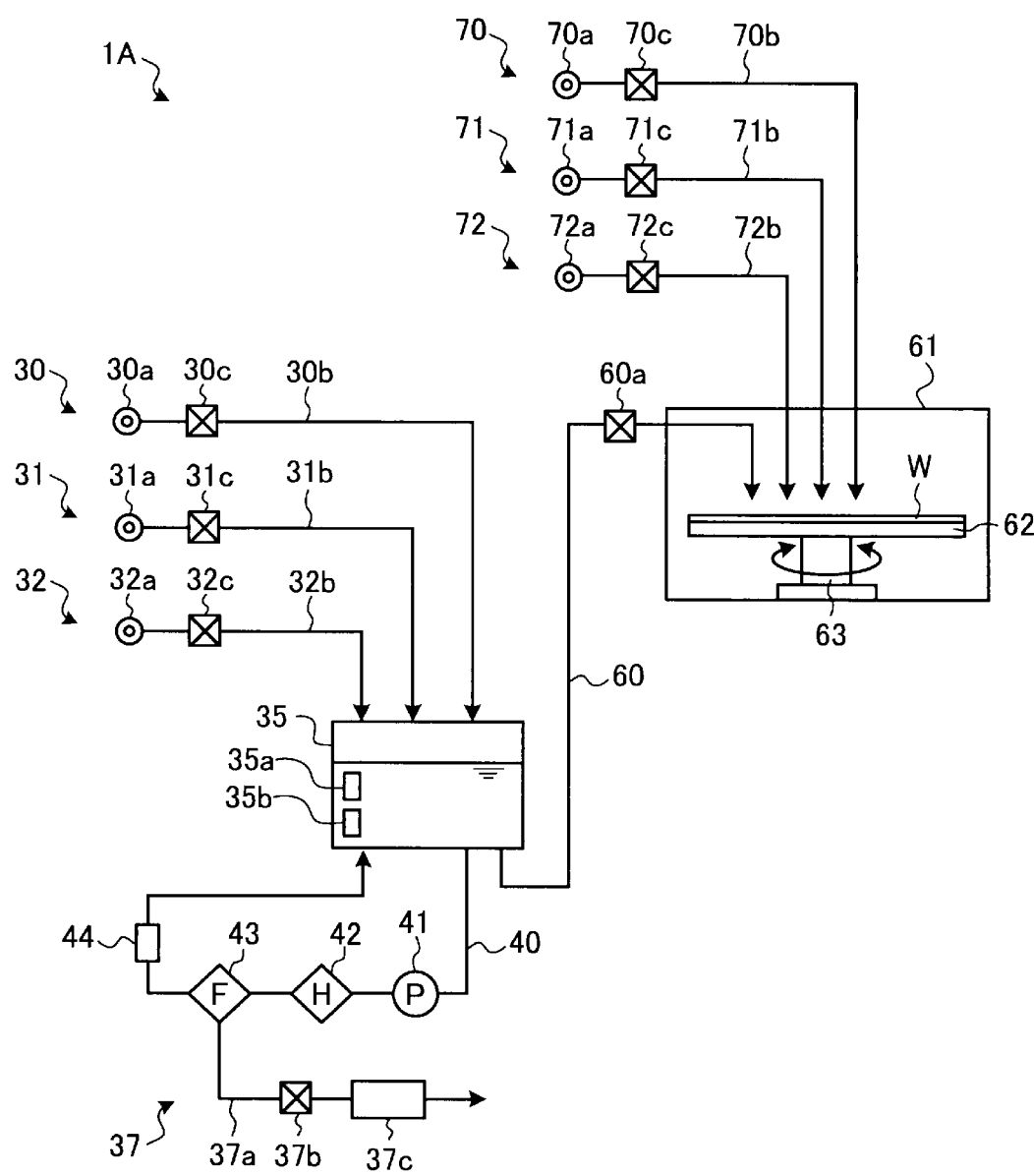
FIG. 13 is a schematic block diagram illustrating a configuration of a substrate processing apparatus according to Modification 4 of the embodiment.

FIG. 13 is a view illustrating a configuration of a substrate processing apparatus 1A according to Modification 4 of the embodiment. In addition, in FIG. 13, the same parts as those in the embodiment illustrated in FIG. 2 are denoted by the same reference numerals, and detailed descriptions thereof are omitted.

In the substrate processing apparatus 1A illustrated in FIG. 13, the phosphoric acid aqueous solution supply 30, the silicon supply 31, and the DIW supply 32 described above are connected to the outer tank 35. Further, the circulation line 40 described above is connected to such an outer tank 35. Thus, the etching liquid whose temperature, phosphoric acid concentration, and silicon concentration have been adjusted is stored in the outer tank 35.

Then, in the substrate processing apparatus 1A, the etching liquid stored in the outer tank 35 is supplied to the single-wafer processing unit 61 via the supply line 60. The supply line 60 has a flow rate regulator 60a. Also, the single-wafer processing unit 61 includes a substrate holder 62 and a rotation mechanism 63.

The substrate holder 62 holds the wafer W horizontally. The rotation mechanism 63 rotates the substrate holder 62 and the wafer W held by the substrate holder 62. Then, the first etching process and the second etching process may be performed on the wafer W by discharging an etching liquid from the outer tank 35 via the supply line 60 onto the upper surface of the wafer W held by the substrate holder 62.

In addition, a rinsing liquid supply 70, a pattern shape processing liquid supply 71, and a cleaning liquid supply 72 are connected to the single-wafer processing unit 61.

The DIW supply 70 includes a DIW supply source 70a, a DIW supply line 70b, and a flow rate regulator 70c. Then, the rinsing liquid supply 70 is operated to discharge a rinsing liquid onto the upper surface of the wafer W held by the substrate holder 62, so that the rinsing process may be performed on the wafer W.

The pattern shape processing liquid supply 71 includes a pattern shape processing liquid supply source 71a, a pattern shape processing liquid supply line 71b, and a flow rate regulator 71c. Then, the pattern shape processing liquid supply 71 is operated to discharge the pattern shape processing liquid onto the upper surface of the wafer W held by the substrate holder 62, so that the processing step and the additional processing step may be performed on the wafer W.

The cleaning liquid supply 72 includes a cleaning liquid supply source 72a, a cleaning liquid supply line 72b, and a flow rate regulator 72c. Then, the cleaning liquid supply 72 is operated to discharge the cleaning liquid onto the upper surface of the wafer W held by the substrate holder 62, so that the cleaning process may be performed on the wafer W.

Then, the controller 7 may perform the etching process of the above-described embodiment and various modified examples on the wafer W by controlling the single-wafer processing unit 61, the flow rate regulators 60a and 70c to 72c, and the like.

The substrate processing apparatus 1 according to the embodiment includes a first processing tank (processing tank 18), a second processing tank (processing tank 20), a transfer unit (lot transfer unit 5), and a controller 7. The first processing tank (processing tank 18) performs an etching process by immersing a substrate (wafer W) on which the silicon oxide film $SiO_2$ and the silicon nitride film SiN are formed in an etching liquid. The second processing tank (processing tank 20) performs a processing step of processing a pattern formed in the silicon oxide film $SiO_2$ on the substrate (wafer W) using a pattern shape processing liquid. The transfer unit (lot transfer unit 5) transfers the substrate (wafer W) to the first processing tank (processing tank 18) and the second processing tank (processing tank 20). The controller 7 controls a first processing tank (processing tank 18), a second processing tank (processing tank 20), and a transfer unit (lot transfer unit 5). Further, the controller 7 controls the transfer unit (lot transfer unit 5) in order to transfer the substrate (wafer W) to the first processing tank (processing tank 18), the substrate transferred to the first processing tank to the second processing tank (processing tank 20), and the substrate transferred to the second processing tank (processing tank 20) to the first processing tank. Thus, a good pattern shape of the silicon oxide film $SiO_2$ may be obtained even with the wafer W on which the silicon nitride film SiN and the silicon oxide film $SiO_2$ are highly stacked.

In addition, the substrate processing apparatus 1 according to the embodiment includes a first processing tank (processing tank 18), a second processing tank (processing tank 20), a transfer unit (lot transfer unit 5), and a controller 7. The first processing tank (processing tank 18) performs an etching process by immersing a substrate (wafer W) on which the silicon oxide film $SiO_2$ and the silicon nitride film SiN are formed in an etching liquid. The second processing tank (processing tank 20) performs a processing step of processing a pattern formed in the silicon oxide film $SiO_2$ on the substrate (wafer W) using a pattern shape processing liquid. The third processing tank (processing tank 18B) performs an etching process by immersing the substrate (wafer W) in an etching liquid. The transfer unit (lot transfer unit 5) transfers the substrate (wafer W) to the first processing tank (processing tank 18A), the second processing tank (processing tank 20), and the third processing tank (processing tank 18B). The controller 7 controls the first processing tank (processing tank 18A), the second processing tank (processing tank 18B), and the transfer unit (lot transfer unit 5). Further, the controller 7 controls the transfer unit (lot transfer unit 5) in order to transfer the substrate (wafer W) to the first processing tank (processing tank 18A), the substrate transferred to the first processing tank to the second processing tank (processing tank 20), and the substrate transferred to the second processing tank (processing tank 20) to the third processing tank (processing tank 18B). Thus, a good pattern shape of the silicon oxide film $SiO_2$ may be obtained even with the wafer W on which the silicon nitride film SiN and the silicon oxide film $SiO_2$ are highly stacked.

Further, in the substrate processing apparatus 1 according to the embodiment, more third processing tanks (processing tanks 18B) are provided than the first processing tanks (processing tanks 18A). Thus, the wafer W may be smoothly etched without waiting for the wafer W to be processed inside the substrate processing apparatus 1.

<Details of Etching Process>

Figure 14:
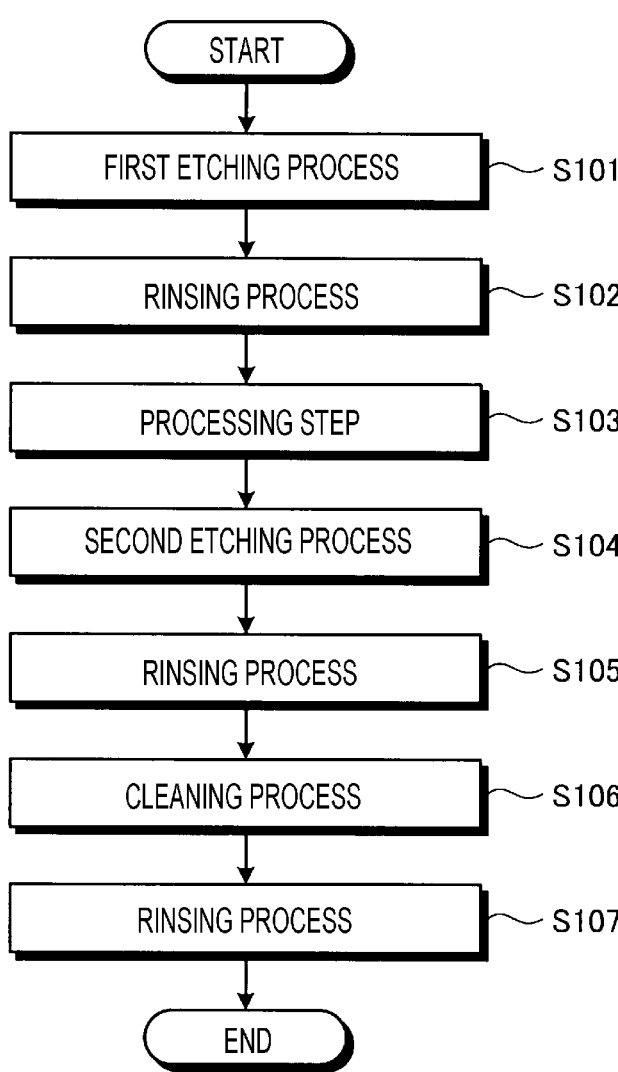
FIG. 14 is a flowchart illustrating a processing procedure of an etching process according to the embodiment.

Subsequently, the details of the etching process performed by the substrate processing apparatus 1 according to the embodiment will be described with reference to FIGS. 14 and 15. FIG. 14 is a flowchart illustrating a processing procedure of an etching process according to the embodiment.

First, the controller 7 performs a first etching process on the wafer W using a predetermined etching liquid (step S101). Next, the controller 7 performs a rinsing process on the wafer W using a predetermined rinsing liquid (step S102). Then, the controller 7 performs a processing step on the wafer W using a predetermined pattern shape processing liquid (step S103).

Next, the controller 7 performs a second etching process on the wafer W using a predetermined etching liquid (step S104). Then, the controller 7 performs a rinsing process on the wafer W using a predetermined rinsing liquid (step S105).

Next, the controller 7 performs a cleaning process on the wafer W using a predetermined cleaning liquid (step S106).

Then, the controller 7 performs a rinsing process on the wafer W using a predetermined rinsing liquid (step S107) and completes the process.

Figure 15:
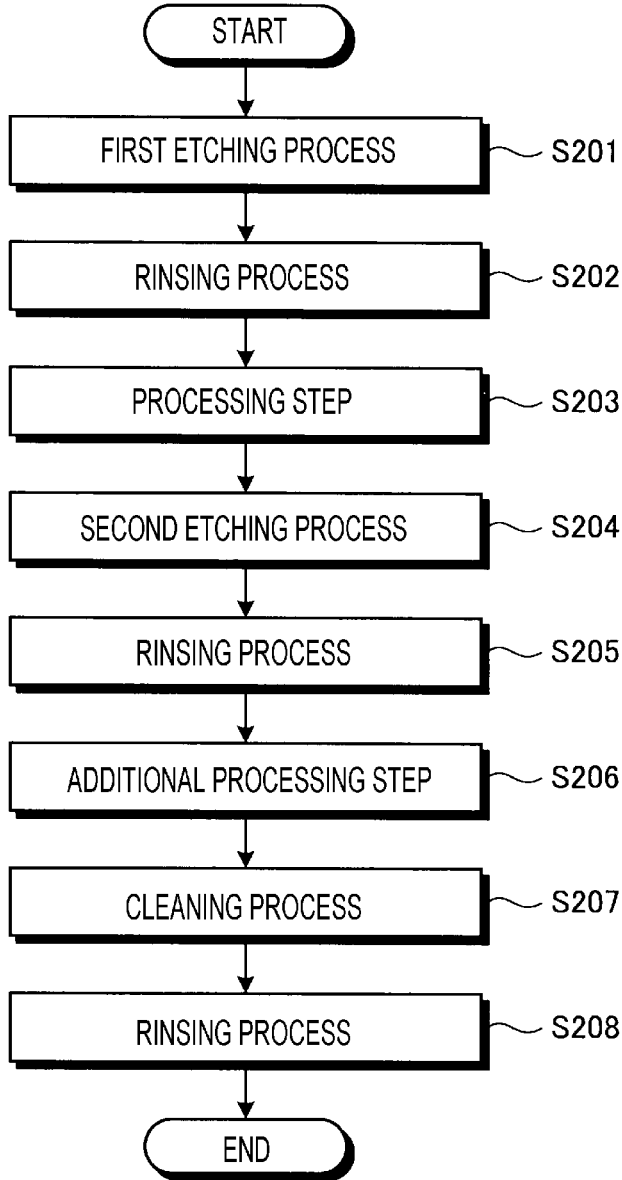
FIG. 15 is a flowchart illustrating a processing procedure of an etching process according to Modification 1 of the embodiment.

FIG. 15 is a flowchart illustrating a processing procedure of an etching process according to Modification 1 of the embodiment.

First, the controller 7 performs a first etching process on the wafer W using a predetermined etching liquid (step S201). Next, the controller 7 performs a rinsing process on the wafer W using a predetermined rinsing liquid (step S202). Then, the controller 7 performs a processing step on the wafer W using a predetermined pattern shape processing liquid (step S203).

Next, the controller 7 performs a second etching process on the wafer W using a predetermined etching liquid (step S204). Then, the controller 7 performs a rinsing process on the wafer W using a predetermined rinsing liquid (step S205).

Next, the controller 7 performs an additional processing step on the wafer W using a predetermined pattern shape processing liquid (step S206). Then, the controller 7 performs a cleaning process on the wafer W using a predetermined cleaning liquid (step S207).

Finally, the controller 7 performs a rinsing process on the wafer W using a predetermined rinsing liquid (step S208) and completes the process.

A substrate processing method according to an embodiment includes a first etching step, a processing step, and a second etching step. In the first etching step, the substrate (wafer W) on which the silicon oxide film $SiO_2$ and the silicon nitride film SiN are formed is etched with an etching liquid. In the processing step, after the first etching step, a pattern formed in the silicon oxide film ($SiO_2$) on the substrate (wafer W) is processed with a pattern shape processing liquid. In the second etching step, the substrate (wafer W) is etched with the etching liquid after the processing step. Thus, a good pattern shape of the silicon oxide film $SiO_2$ may be obtained even with the wafer W on which the silicon nitride film SiN and the silicon oxide film $SiO_2$ are highly stacked.

Further, in the substrate processing method according to the embodiment, the pattern shape processing liquid has no etching capability or a low etching capability with respect to the silicon nitride film SiN. Thus, the shape of the silicon nitride film SiN may be maintained in the processing step.

Further, in the substrate processing method according to the embodiment, the first etching step is performed until the tip portion E of the pattern formed in the silicon oxide film $SiO_2$ is exposed, and the processing step is performed to process the exposed tip portion E. Thus, it is possible to suppress the block oxide film filling the memory hole M from being erroneously etched in the processing step after the first etching process.

Further, in the substrate processing method according to the embodiment, the temperature of the etching liquid in the first etching step is set to be lower than the temperature of the etching liquid in the second etching step. Thus, by lowering the etching rate of SiN in the first etching step, a local increase in the silicon concentration may be suppressed in the initial stage, and the deposition of the silicon oxide R may be suppressed.

Further, in the substrate processing method according to the embodiment, the silicon concentration of the etching liquid in the first etching step is set to be lower than the silicon concentration of the etching liquid in the second etching step. This may suppress the silicon oxide R from being deposited on the surface of the silicon oxide film $SiO_2$ during the first etching process.

Further, the substrate processing method according to the embodiment further includes, after the second etching step, an additional processing step of processing a pattern formed in the silicon oxide film $SiO_2$ with a pattern shape processing liquid. This makes it possible to remove the silicon oxide R deposited on the surface of the tip portion E of the silicon oxide film $SiO_2$ after the second etching process.

Further, in the substrate processing method according to the embodiment, the etching liquid contains a phosphoric acid and an additive that suppresses re-deposition of the silicon oxide R. Thus, the silicon nitride film SiN may be etched with a high selectivity with respect to the silicon oxide film $SiO_2$, and the deposition of the silicon oxide R on the silicon oxide film $SiO_2$ may be suppressed.

Further, in the substrate processing method according to the embodiment, the processing time in the additional processing step is set to a time for processing only the silicon oxide R formed on the surface of the silicon oxide film $SiO_2$. Thus, it is possible to suppress the pattern shape of the silicon oxide film $SiO_2$ from being etched excessively.

Further, in the additional processing step, as a method of processing only the silicon oxide R formed on the surface of the silicon oxide film $SiO_2$, the etching rate of the pattern shape processing liquid may be reduced, or an additional processing step may be performed with the pattern shape processing liquid having a high silicon concentration.

Although the embodiments of the present disclosure have been described above, the present disclosure is not limited to the above embodiments, and various changes may be made without departing from the gist of the present disclosure. For example, in the above-described embodiments, descriptions have been made on an example in which a solution in which a silicon-containing compound is added to a phosphoric acid aqueous solution to adjust the silicon concentration is used as an etching liquid, but an $SiO_2$ deposition inhibitor or the like may be further added to the etching liquid.

According to the present disclosure, a good pattern shape of a silicon oxide film may be obtained even on a substrate on which a silicon nitride film and a silicon oxide film are highly stacked.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus that processes a substrate, the substrate processing apparatus comprising:
   a first processing tank storing an etching liquid and allowing the substrate to be immersed therein, including:
      a phosphoric acid aqueous solution supply source;
      a DIW (deionized water) supply source;
      a silicon supply source connected to a silicon supply line; and
      a temperature control tank connected to the first processing tank via a processing supply line;
   a second processing tank storing a pattern shape processing liquid and allowing the substrate to be immersed therein;

a transfer channel including a rail configured to transfer the substrate between the first processing tank and the second processing tank via the rail; and
   a controller configured to control an overall operation of the substrate processing apparatus, the controller in communication with the first processing tank, the second processing tank and the transfer channel, and the controller is programmed to:
      transfer the substrate having a silicon oxide film and a silicon nitride film to the first processing tank, and first etch the substrate with the etching liquid stored in the first processing tank until a tip portion of a pattern formed in the silicon oxide film is exposed, wherein the etching liquid selectively etches the silicon nitride film among the silicon nitride film and the silicon oxide film on the substrate during the first etch;
      transfer the substrate to the second processing tank, and second etch the substrate with the pattern shape processing liquid to process the exposed tip portion, wherein the silicon oxide deposited on the tip portion of the silicon oxide film during the first etch is etched by the second etch; and
      transfer the substrate to the first processing tank, and third etch the substrate with the etching liquid stored in the first processing tank to further etch the silicon nitride film,
      wherein each of phosphoric acid concentration, silicon concentration, and temperature of the etching liquid in the first processing tank are adjusted for the first etch and the third etch.

2. The substrate processing apparatus according to claim 1, wherein etching ability of the pattern shape processing liquid with respect to the silicon nitride film is lower than the etching ability of the etching liquid.

3. The substrate processing apparatus according to claim 1, wherein the first processing tank is provided with a temperature sensor in communication with the controller, and—a first temperature of the etching liquid for the first etch is set to be lower than a second temperature of the etching liquid for the third etch.

4. The substrate processing apparatus according to claim 1, wherein the first processing tank is provided with a concentration sensor in communication with the controller, and a first silicon concentration of the etching liquid in the first etch is set to be lower than a second silicon concentration of the etching liquid in the third etch.

5. The substrate processing apparatus according to claim 1, wherein the controller is further programmed to, after the third etch, transfer the substrate to the second processing tank, where a fourth etch of the substrate with the pattern shape processing liquid is performed to further process the exposed tip portion.

6. The substrate processing apparatus according to claim 1, wherein the etching liquid comprises a phosphoric acid and an additive configured to suppress re-deposition of silicon oxide.

7. The substrate processing apparatus according to claim 1, wherein the pattern shape processing liquid is diluted hydrofluoric acid (DHF) or SC1 wherein the SC1 is a mixed liquid of ammonia, hydrogen peroxide and water.

8. A substrate processing apparatus that processes a substrate, the substrate processing apparatus comprising:
   a first processing tank storing a first etching liquid and allowing a substrate to be immersed therein;

a second processing tank storing a pattern shape process-
ing liquid and allowing the substrate to be immersed
therein;

a third processing tank storing a second etching liquid and
allowing the substrate to be immersed therein;

wherein each of the first processing tank and the third
processing tank includes:

a phosphoric acid aqueous solution supply source;

a DIW (deionized water) supply source;

a silicon supply source connected to a silicon supply
line; and a temperature control tank connected to the first or third
processing tanks via a processing supply line;

a transfer channel including a rail configured to transfer
the substrate to and from the first processing tank, to
and from the second processing tank, and to and from
the third processing tank; and a controller in communication with the first processing
tank, the second processing tank, the third processing
tank, and the transfer channel, configured to control an
overall operation of the substrate processing apparatus,
and the controller is programmed to:

transfer the substrate having a silicon oxide film and a
silicon nitride film to the first processing tank, and
first etch the substrate with the first etching liquid stored in the-first processing tank until a tip portion
of a pattern formed in the silicon oxide film is
exposed, wherein the first etching liquid selectively
etches the silicon nitride film among the silicon
nitride film and the silicon oxide film on the substrate
during the first etch;

transfer the substrate to the second processing tank, and
second etch the substrate with the pattern shape
processing liquid to process the exposed tip portion,
wherein the silicon oxide deposited on the tip portion
of the silicon oxide film during the first etch is etched
by the second etch; and transfer the substrate to the third processing tank, and
third etch the substrate with the second etching liquid
stored in the third processing tank, to further etch the
silicon nitride film, wherein each of phosphoric acid concentration, silicon
concentration, and temperature of the first etching
liquid in the first processing tank and the second
etching liquid in the third processing tank are
adjusted for the first etch and the third etch.

9. The substrate processing apparatus according to claim
8, wherein the third processing tank is provided in a larger
number than the first processing tank.

* * * * *